US006677167B2

(12) United States Patent
Kanno et al.

(10) Patent No.: US 6,677,167 B2
(45) Date of Patent: Jan. 13, 2004

(54) WAFER PROCESSING APPARATUS AND A WAFER STAGE AND A WAFER PROCESSING METHOD

(75) Inventors: Seiichiro Kanno, Chiyoda (JP); Hironobu Kawahara, Kudamatsu (JP); Mitsuru Suehiro, Kudamatsu (JP); Saburou Kanai, Hikari (JP); Toshio Masuda, Toride (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/086,722

(22) Filed: Mar. 4, 2002

(65) Prior Publication Data
US 2003/0164226 A1 Sep. 4, 2003

(51) Int. Cl.[7] .............................................. H01L 21/66
(52) U.S. Cl. ............................. 438/14; 438/15; 438/16; 438/401; 355/72
(58) Field of Search ......................... 438/14–16, 401; 355/72, 75; 361/234

(56) References Cited

U.S. PATENT DOCUMENTS 4,897,171 A * 1/1990 Ohmi ...................... 204/298.15
5,382,469 A * 1/1995 Kubota et al. ................ 428/332
5,557,215 A * 9/1996 Saeki et al. ................... 324/765
5,751,538 A * 5/1998 Nakasuji ...................... 361/234
5,854,819 A * 12/1998 Hara et al. ...................... 378/34
6,331,885 B1 * 12/2001 Nishi ............................ 355/53
6,366,342 B2 * 4/2002 Tanaka ........................... 355/75
6,429,090 B1 * 8/2002 Fujiwara et al. ............. 438/401
6,433,346 B1 * 8/2002 Hirayanagi ................ 250/492.2
6,456,019 B1 * 9/2002 Gordon et al. ............... 315/383
6,496,350 B2 * 12/2002 Fujiwara ...................... 361/234
6,509,957 B1 * 1/2003 Tanaka ........................... 355/72

FOREIGN PATENT DOCUMENTS

JP         7-249586           9/1995

* cited by examiner

Primary Examiner—John F. Niebling
Assistant Examiner—Olivia Luk
(74) Attorney, Agent, or Firm—Antonelli, Terry, Stout & Kraus, LLP

(57) ABSTRACT

A wafer processing apparatus comprising a wafer stage, wherein a semiconductor wafer is mounted on the wafer stage so as to process the semiconductor wafer, wherein a holding mechanism of the wafer stage is commonly used for a plurality of wafer stages, and accordingly, the wafer stage can be changed into a wafer stage having a different function so as to process the semiconductor wafer.

24 Claims, 19 Drawing Sheets

WAFER PROCESSING APPARATUS AND A WAFER STAGE AND A WAFER PROCESSING METHOD

BACKGROUND OF THE INVENTION

The present invention relates to a semiconductor manufacturing technology, and in particular to temperature control for a wafer, which is required for processing a semiconductor wafer in a semiconductor manufacturing apparatus.

These years, the diameter of a wafer to be processed by a semiconductor manufacturing technique, becomes larger and larger so as to fall in a range from 8 to 12 inches. This is because a number of chips, which are available from a single wafer, is to be increased so as to reduce the manufacturing cost. However, as a result, this fact has forced manufacturers of semiconductor equipments into development of an apparatus capable of manufacturing large diameter wafers with enormous investments.

However, on one hand, in view of the relationship to other apparatus in an ordinal manufacturing line, since there is raised such a problem, as an actual circumstance, that all apparatus ordered by clients are not always those which can cope with large diameter wafers, and accordingly, it is required to design, evaluate and produce a new apparatus for every size of wafers desired by a client, resulting in a heavy task to the manufacturer of semiconductor equipments.

Further, due to highly increased integration of semiconductor chips, these years, required machining accuracy has becomes more and more severe, and accordingly, the control of the temperature of a wafer during processing has been more and more important. For example, in order to materialize anisotropic etching in an etching process which requires a high aspect ratio, a process in which etching is made while a side wall is protected by organic polymer is used, but in this process, the degree of formation of the organic polymer serving as a protecting film is changed in dependence upon a temperature.

Accordingly, if the distribution of temperature of a wafer on processing is not uniform, the degree of formation of the protection film on a side wall becomes uneven within the surface of the wafer, and as a result, there is raised a problem of unevenness in an etching shape. Further, in addition to this fact, since the diameter of the wafer becomes larger and larger, as mentioned above, so that the input heat to the wafer tends to be more and more large, that is, for example, a bias power applied to an wafer in a process of etching an inter-layer-dielectric on a manufacturing line for 12 inch diameter wafers becomes higher up to 3 kW, and accordingly, to uniform the temperature distribution in the surface of the wafer causes a very important technical task.

By the way, during plasma processing, a wafer is electrostatically attracted and held to a stage by means of an electrostatic chuck, at this stage, in order to ensure heat transfer between the wafer and the stage, a method in which gas for heat transfer (usually helium is used) is introduced for cooling, has been conventionally used. Further, although the structure of the electrostatic chuck should be changed variously, depending upon a specification of an apparatus, in a typical example, a high thermal conductive metal such as aluminum which is covered on its outer surface with a ceramic film having a thickness of not greater than about 1 mm is used as a base, and a temperature adjusting medium controlled by an external temperature adjusting unit is circulated through the base in order to adjust the temperature.

At this stage, the range of temperature to be controlled is various in dependence upon a process to be used. As to the temperature of the stage for holding the wafer, stable operation is required over a wide range from, for example, −40 deg.C. to a high temperature up to about 100 deg.C. That is, severe requirements have been imposed such that even though heat is inputted to a wafer stage in a plasma processing apparatus in a wide range from a low temperature to a high temperature, a uniform temperature distribution should be materialized over a wafer having a large diameter.

By the way, in an actual electrostatic chuck structure, it is, in general, overhanged from the outer periphery of a wafer by several millimeters, and accordingly, cooling in the vicinity of the outer periphery of the wafer is insufficient, resulting in main cause of deterioration of the temperature distribution over the surface of the wafer. Thus, several ideas for optimizing a method of introduction of helium gas passing between the electrostatic chuck and the back-side surface of the wafer, and the pressure thereof have been conventionally proposed.

However, in a certain method which has been conventionally proposed, since the chuck has a specific structure which is optimized for wafers having a specific size, redesigning has to be additionally made for the electrostatic chuck and the structure of the lower part of the apparatus to which the chuck is mounted, as a whole. Thus, it has been extremely ineffective.

It is noted that a method of improving the temperature distribution over the surface of a wafer is disclosed as a conventional example in JP-A-7-249586 which discloses such a structure that first and second gas passages which are opened at the outer surface of a lower electrode in the vicinity of its outer periphery, and at a plurality of positions therein, and both gas passages in dual systems are connected thereto with first and second gas supply and discharge means, respectively, so as to supply helium gas to the gas passages, independent from each other, in order to cool a semiconductor wafer.

It cannot be safely said that consideration is sufficiently made as to variation of the wafer processing function, and it is raised a problem in view of restraining the cost.

That is, in the conventional technology, since the structure is optimized for a wafer having a certain specific size, it becomes extremely inefficient if the structure is used for wafers having different sizes, and as a result, there is raised such a problem that the cost cannot be restrained from increasing.

Further, since the conventional technology requires the gas supply and discharge means which are independent from each other between the position in the vicinity of the outer periphery of the wafer and the inner periphery thereof, the change of the wafer processing function is complicated and expensive.

Further, in the conventional technology, it is required to set the pressure of helium gas to be fed in the vicinity of the outer periphery of the wafer to a high value, up to about 30 Torr, and accordingly, the attracting force of the electrostatic chuck has to be set to a value which can match with the pressure. As a result, the cost is further increased. It is here estimated that erroneous attraction occurs. The wafer on processing is greatly corrupted, and accordingly, there is raised such a problem that the burden caused by recovery works becomes heavier. Thus, it is inevitable to increase the attraction force.

Detailed explanation will be hereinafter made of the problems inherent to the conventional technology with reference to FIGS. 9 and 10 of which FIG. 9 shows an example of a prior art wafer processing apparatus which are formed for processing a 8 inch wafer and FIG. 10 is an example of a water processing apparatus for processing a 12 inch wafer. At first the prior art shown in FIG. 9 will be explained. In the apparatus shown in FIG. 9, etching gas is introduced into a vacuum chamber 9, as shown, and the pressure in the chamber 9 is set to an appropriate value by adjusting the opening degree of a valve 12 provided upstream of a turbo-molecular pump 13.

Further, a parallel planar type upper electrode 100 is laid in the upper part of the vacuum chamber 9 and is connected to a high frequency power source 8 so as to be applied thereto with a high frequency voltage having a frequency of, for example, 13.56 MHz in order to generate plasma 6 to which a wafer 1 is exposed so as to subject the wafer 1 to an etching process.

Here, in the case of FIG. 9, the diameter of the wafer 1 is 8 inches, and is set on convex part formed on a water stage which has a diameter of 190 mm and which is located being opposed to the upper electrode 10. The reason why the diameter of the convex part on which the wafer is set, is smaller than the diameter of the wafer 1 which is 200 mm (8 inches) is such that the outer surface of the wafer stage 40 is protected from the plasma 6.

In this case, the wafer stage 40 has a diameter of 240 mm, and is formed of a member composed of an aluminum lower cover 42 and a base 41 which are blazed to each other, and is formed on its outer surface with a dielectric film 21 made of ceramic as a main component and having a thickness of 1 mm, by spray coating. The wafer stage 40 is secured to an insulation member 7 fixed to a flange 5, by means of bolts 19, and is electrically insulated from the vacuum chamber 9. In this arrangement, the bolts 19 are circumferentially provided by a number of 12 at positions having a diameter of 220 mm.

A through hole 14 for introduction of helium gas is formed in the wafer stage 40 at the center of the latter, and is covered with a ceramic susceptor 43 so as to protect the outer periphery thereof. Further, concentric temperature adjusting grooves 15 are formed in the wafer stage 40, and are communicated with an introduction port 44 and a discharge port 45 which are formed piercing through the flange 5 and the insulation member, and through which the temperature adjusting grooves 15 are connected to pipe lines 46, 47.

Each of these pipe lines 46, 47 has a double pipe structure in order to prevent occurrence of dew formation even though coolant having a low temperature such as −40 deg.C. is circulated therethrough, and internal pipe lines 48, 49 are vacuum-insulated from heat. It is noted here that the above-mentioned introduction port 44 and the discharge port 45 are provided at positions having a distance of 100 mm from the center.

The pusher pins 50 serve to peel off the wafer 1 attracted to the wafer stage 40, and accordingly, it is configured to move up and down in association with telescopic motion of a transfer mechanism which is not shown and bellows 51. The number of the pusher pins 50 is three which are located at positions with a radius of 50 mm.

Next, the wafer stage 40 is connected to a high frequency power source 20 in a condition in which it is electrically isolated from the flange 50 by means of an insulating connection part 18, and accordingly, it can be applied with a bias voltage having a frequency of, for example, 800 kHz. Thus, a bias potential is effected at the wafer 1 so as to effectively introduce ions in order to carry out anisotropic etching or increase the etching rate, thereby it is possible to enhance the etching performance.

However, since the injection of the ions causes heat generation, should the ions are injected to the wafer, the wafer would be heated up to a high temperature. Accordingly, as mentioned above, coolant having a temperature which has been adjusted to a predetermined temperature is circulated through the temperature adjusting grooves 15 formed in the wafer stage 40, from an external temperature adjusting machine.

However, even with a normal etching condition, the pressure of a processing chamber or the vacuum chamber 9 is low, that is, not higher than several Pa. Accordingly, the thermal resistance between the wafer 1 and the wafer stage 40 is high so that no sufficient cooling effect can be obtained. Thus, inert gas having a relatively high thermal conductivity, such as helium gas, is introduced between the wafer 1 and the wafer stage 40 by way of the through holes 14 in order to aim at improving the thermal conductivity. It is noted that the pressure of this gas is adjusted by controlling a flow rate controller 25 in accordance with a value detected by a pressure gauge 24 connected to a pipe line 23.

It is noted that D.C. current is applied to the wafer stage 40 from a D.C. power source 22 so as to electrostatically attract the wafer 1 in order to prevent the wafer from coming off from the wafer stage 40 by a pressure of the gas which is set to a value in a rage of about 500 to 3 k Pa. That is, since the wafer 1 makes contact with the plasma, it is held at a potential which is substantially the same as that of the vacuum chamber 9, and accordingly, a potential difference is caused between the wafer 1 and the wafer stage 40 so that the wafer 1 is electrostatically attracted by a Coulomb's force by a charge effected in a dielectric film 21.

Next, explanation will be made of a prior art technology 10 shown in FIG. 10. In this case, the configuration including, for example, the upper electrode is the same as that of the prior art technology shown in FIG. 9, but the diameter of the wafer stage 40 is enlarged to 340 mm in order to cope with a wafer 95 having a diameter of 12 inches. Accordingly, the sizes of the insulation member 7 and the flange 5 for securing the wafer stage 40 are changed.

Specifically, the convex part (upper part) of the wafer stage on which the wafer 95 is set, has a diameter of 90 mm, screws 19 with which the wafer stage is secured to the insulation member 7 are located at positions with a diameter of 320 mm. Further, since the distribution of heat input to a wafer on processing is different between a wafer having 8 inches and a wafer having 12 inches, it is required to change the configuration of the temperature adjusting grooves 15, and as a result, the introduction port 44 and the discharge port 45 connecting the temperature grooves 15 and the pipe lines are shifted to positions having a distance of 145 mm from the center. Thus, the dimensions and the structure thereof are completely different from those of the processing apparatus for 8 inch wafers.

Thus, in the prior art technology, the dimensions and the structure of the apparatus are different among sizes of wafers and accordingly, the above-mentioned problems are caused. In detail, in the consideration of the stand point of an apparatus manufacturer, a problem of heavy burden upon the designers is caused. That is, new design is required for all component parts for every one of different wafer sizes. However, almost semiconductor manufacturing apparatus have complicated structures with a large number of component parts, and accordingly, the labor costs for the designers are increased. As a result, the apparatus becomes expensive.

As to a next problem, a large number of component parts should be managed, and accordingly, stock components reserved in a firm is increased. Further, due to the large number of component parts, a disposal which should be taken for a trouble raised on the client side is delayed, which becomes a secondary problem. Further, in this case, the delivery of component parts to the client side is finally made by worker, but since almost cases are such that not only a larger number of component parts are present but also component parts have shapes which are similar to one another except their dimensions, it is likely to cause errors during the delivery.

Next, as to a hindrance caused on the user side, first of all, the introduction cost of the apparatus is expensive. That is, even though a processing apparatus for wafers having a certain size is owned, since the structure of the lower part of the apparatus should be modified in its entity in order to cope with wafers having a different diameter, the apparatus cannot be immediately used. Accordingly, a new apparatus has to be introduced or the change of the diameter of wafers should be given up.

Further, the above-mentioned problem is not always limited to the enlargement of the size of wafer. For example, even though a processing apparatus capable of processing wafers having a 12 inch diameter has been introduced, there might be often caused such a case as to process wafers having a 8 inch diameter. In this case, although a wafer having a 8 inch diameter may be set on a wafer stage for a wafer having a 12 inch diameter, this wafer cannot actually be processed due to problems of a temperature distribution over the wafer and transfer of the wafer. Further, as to another problem, as already detailed in the problem of the manufacturer side, the time for replacement of component parts becomes longer.

Next, explanation will be made of hindrance caused by a wafer stage manufacture. In a relatively large number of cases, component parts relating to the wafer stage is purchased from an external supplier, and accordingly, in this case, the external wafer stage manufacturer has to change the dimensions of every component part for every of the wafer sizes, and accordingly, redesigning thereof is required. The burden upon the designers must be heavy and be increased. Further, since the specification of the wafer stage is different among apparatuses, there is a problem of increasing the kinds of stock components.

SUMMARY OF THE INVENTION

A first object of the present invention is to provide a wafer processing apparatus in which a wafer stage can be replaced with any of a plurality of inexpensive wafer stages having different functions, and a second object of the present invention is to provide an inexpensive wafer processing apparatus which can optimize the temperature distribution over the surface of the wafer.

Further, a third object of the present invention is to provide a common single wafer stage which is inexpensive and which can be used solely, instead of a plurality of wafer stages having different functions, and a fourth object of the present invention is to provide a wafer stage which is inexpensive and which can optimize the temperature distribution over the surface of a wafer.

Further, a fifth object of the present invention is to provide a wafer processing method which can maximize the processing capacity of a wafer processing apparatus.

The above-mentioned first object can be attained by a wafer processing apparatus of a type which comprises a wafer stage and processes a semiconductor wafer set on this wafer stage, wherein a wafer holding mechanism is commonly used among a plurality of wafer stages, and the aforementioned wafer stage can be changed into one of the plurality of stages having different functions in order to process the semiconductor wafer.

The first object can also attained by having a wafer stage incorporated in a wafer processing apparatus, for holding a semiconductor wafer, which can be separated from a structure to which the wafer stage is secured, and by commonly using, among a plurality of wafer stages having different functions, the positions and the structures of means for securing a wafer stage to the above-mentioned structure, component parts with which alignments between the structure and the wafer stage are required, such as for example, an electrical connection structure or a transfer mechanism for the semiconductor wafer, a cooling structure for the wafer stage, through-holes for introducing cooling gas between the semiconductor wafer and the wafer stage, or various wafer monitoring mechanisms, in order to simply change the wafer stage into the one having a different function.

Next, the second object can be attained by the provision of a heat insulating layer having a heat conductivity which is lower than that of a material of the wafer stage, in a wafer stage incorporated in a wafer processing apparatus.

Further, the third object can be attained by having a wafer stage incorporated in a wafer processing apparatus, for holding a semiconductor wafer, which can be separated from a structure to which the wafer stage is secured, by commonly using, among a plurality of wafer stages having different functions, the positions and structures of means for securing a wafer stage, components parts with which alignment is required between the structure and the wafer stage, such as an electrical connection structure or a transfer mechanism for the semiconductor wafer, a cooling structure for the wafer stage or through holes for introducing cooling gas between the semiconductor wafer and the wafer stage or various monitor mechanism for the wafer, in order to enable any of the plurality of water stages to be mounted to the structure.

Further, the fourth object can be attained by the provision of a heat insulating layer having a heat conductivity which is lower than a material of the wafer stage in the wafer stage incorporated in a wafer processing apparatus.

Further, the fifth object can be attained by monitoring a temperature of a semiconductor wafer on processing, a temperature of coolant flowing through a wafer stage or thermal data from a wafer stage, and controlling the status of the apparatus in accordance with the thermal data.

Other objects, features and advantages of the invention will become apparent from the following description of the embodiments of the invention taken in conjunction with the accompanying drawings.

DETAILED DESCRIPTION OF THE INVENTION

Figure 1:
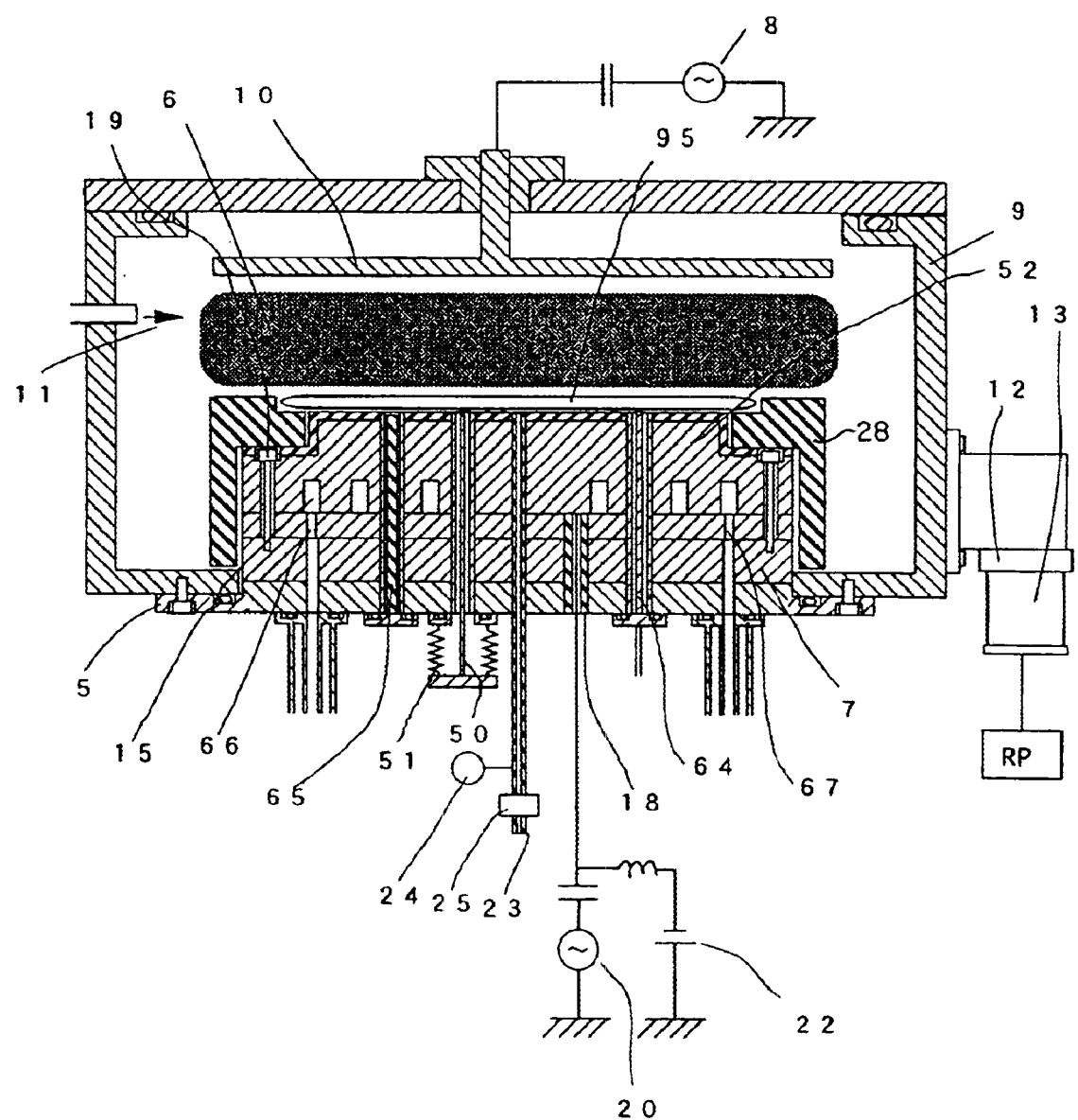
FIG. 1 is a sectional view illustrating a first embodiment of a wafer processing apparatus according to the present invention.
Figure 2:
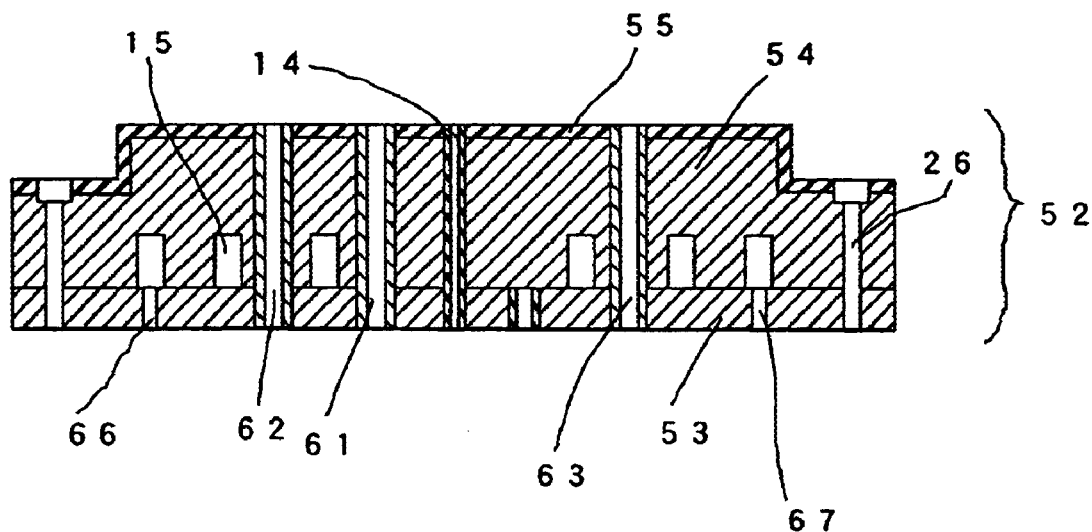
FIG. 2 is a sectional view illustrating a wafer stage in the first embodiment of the present invention.
Figure 3:
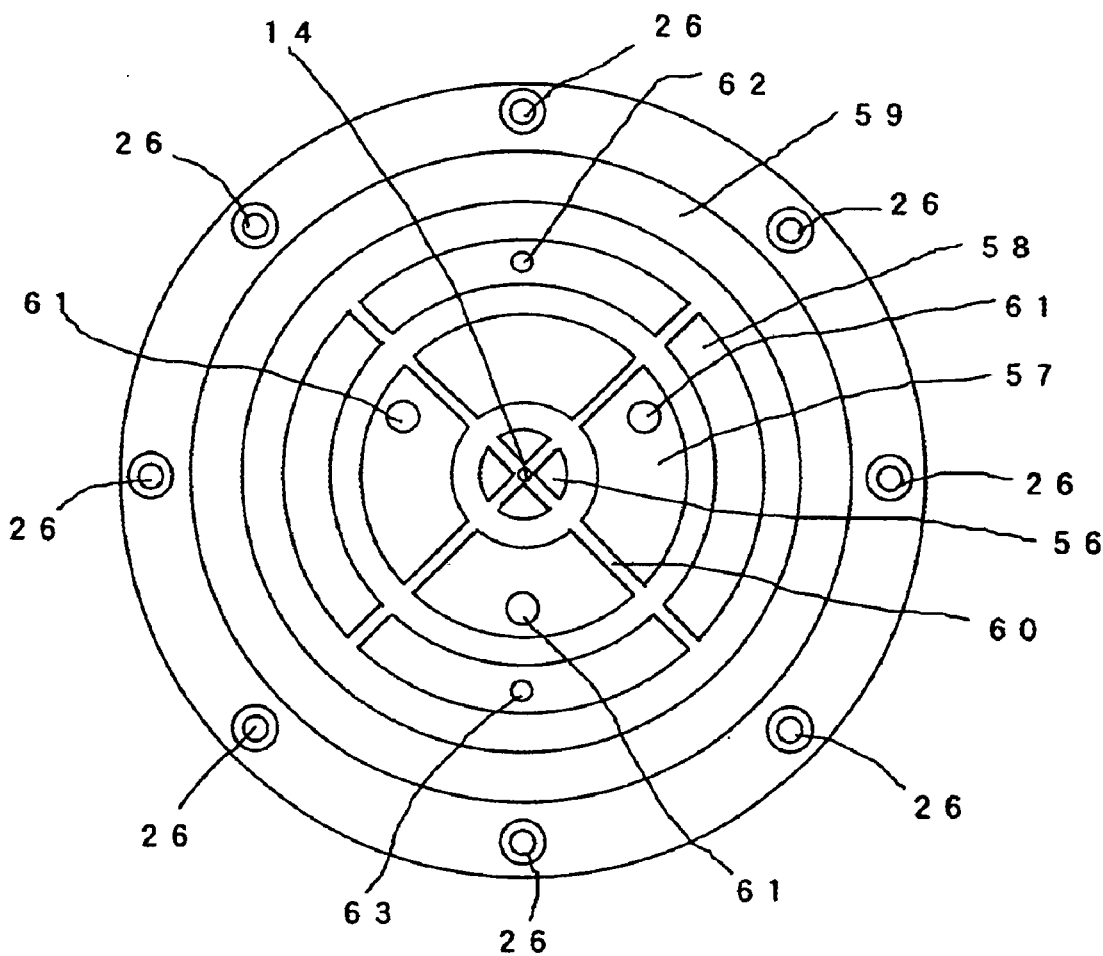
FIG. 3 is a front view illustrating the wafer stage in the first embodiment of the present invention.
Figure 4:
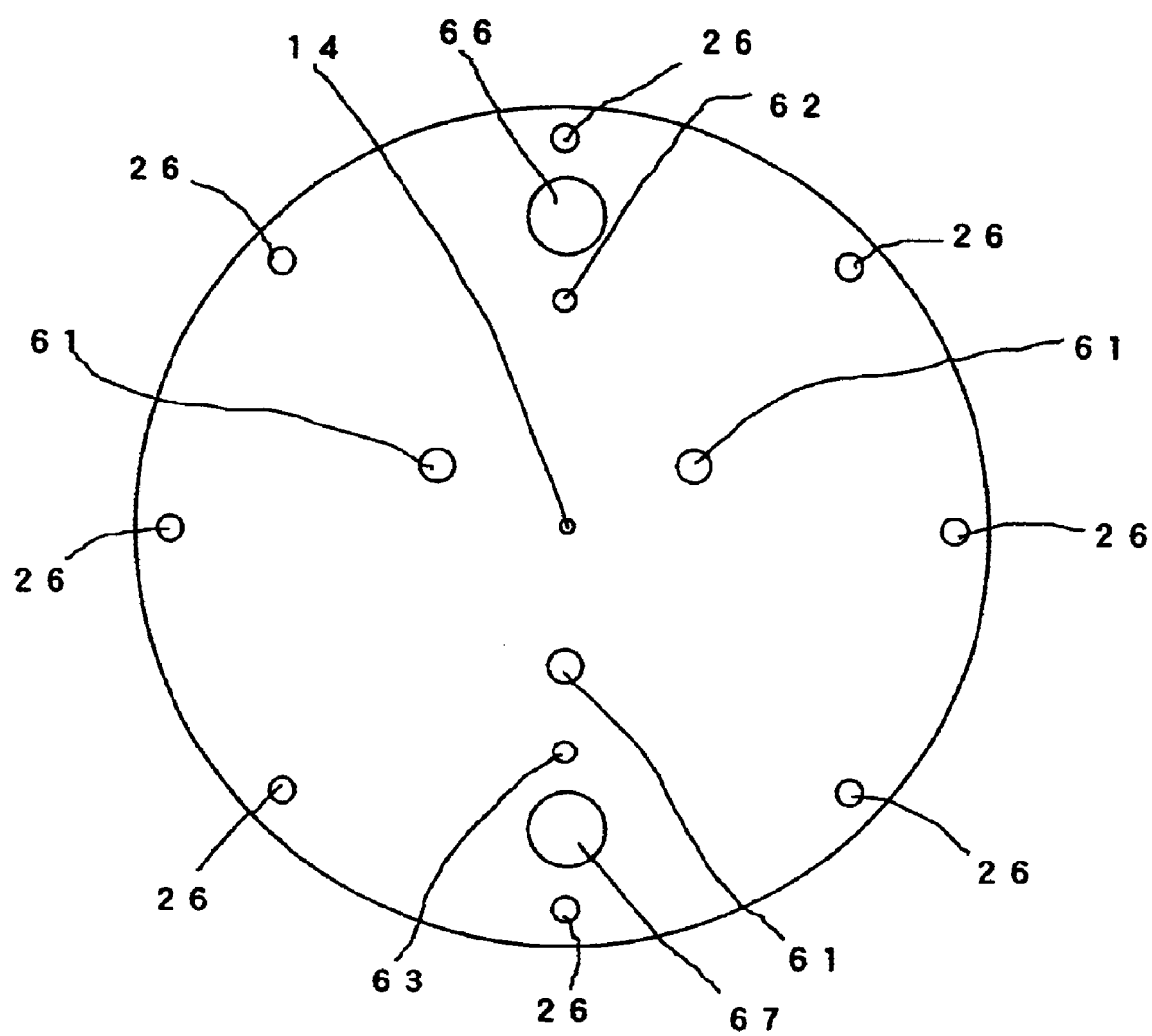
FIG. 4 is a rear view illustrating the wafer stage in the first embodiment of the present invention.
Figure 5:
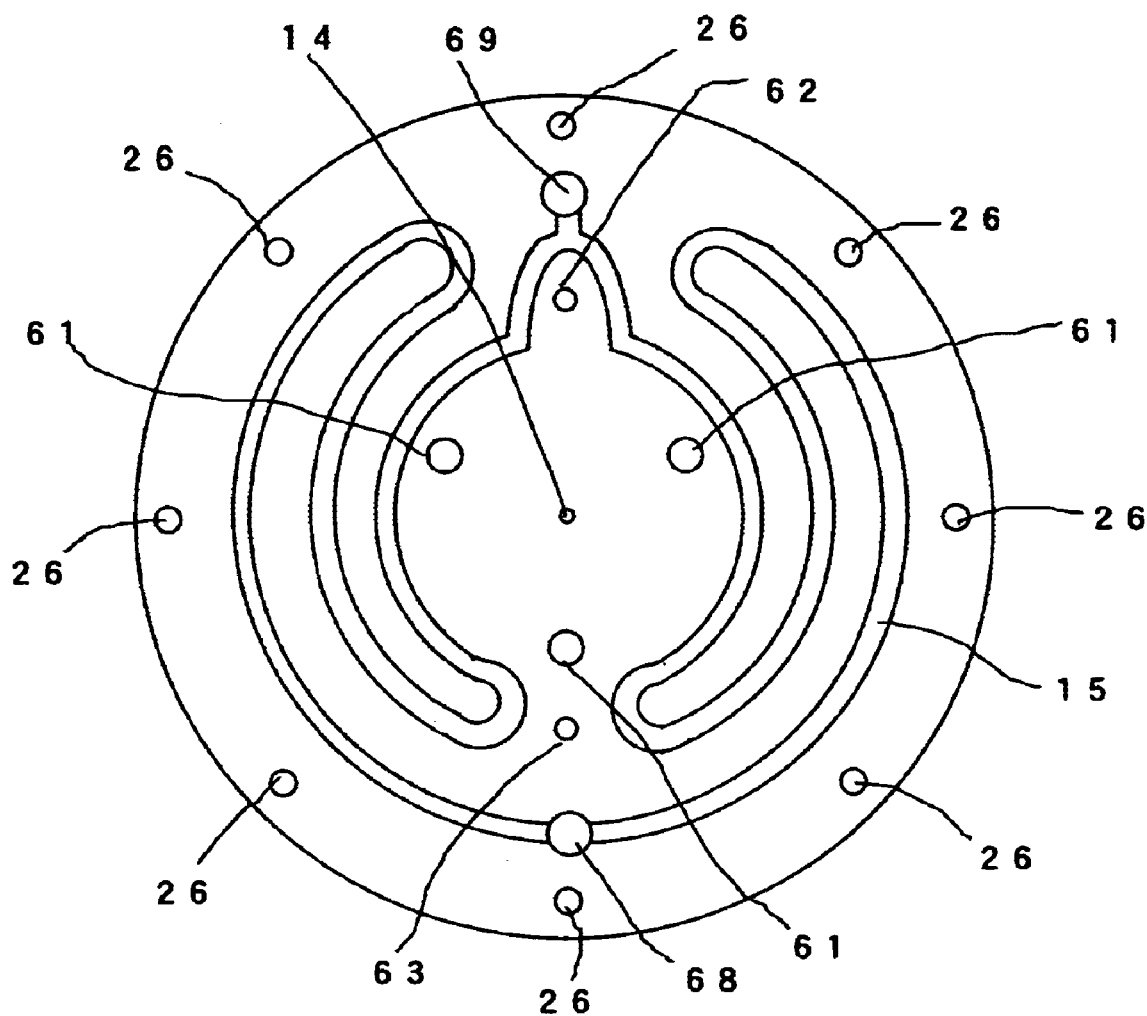
FIG. 5 is a rear view illustrating the wafer stage in the first embodiment of the present invention, which is viewed from a certain section of the wafer stage.
Figure 9:
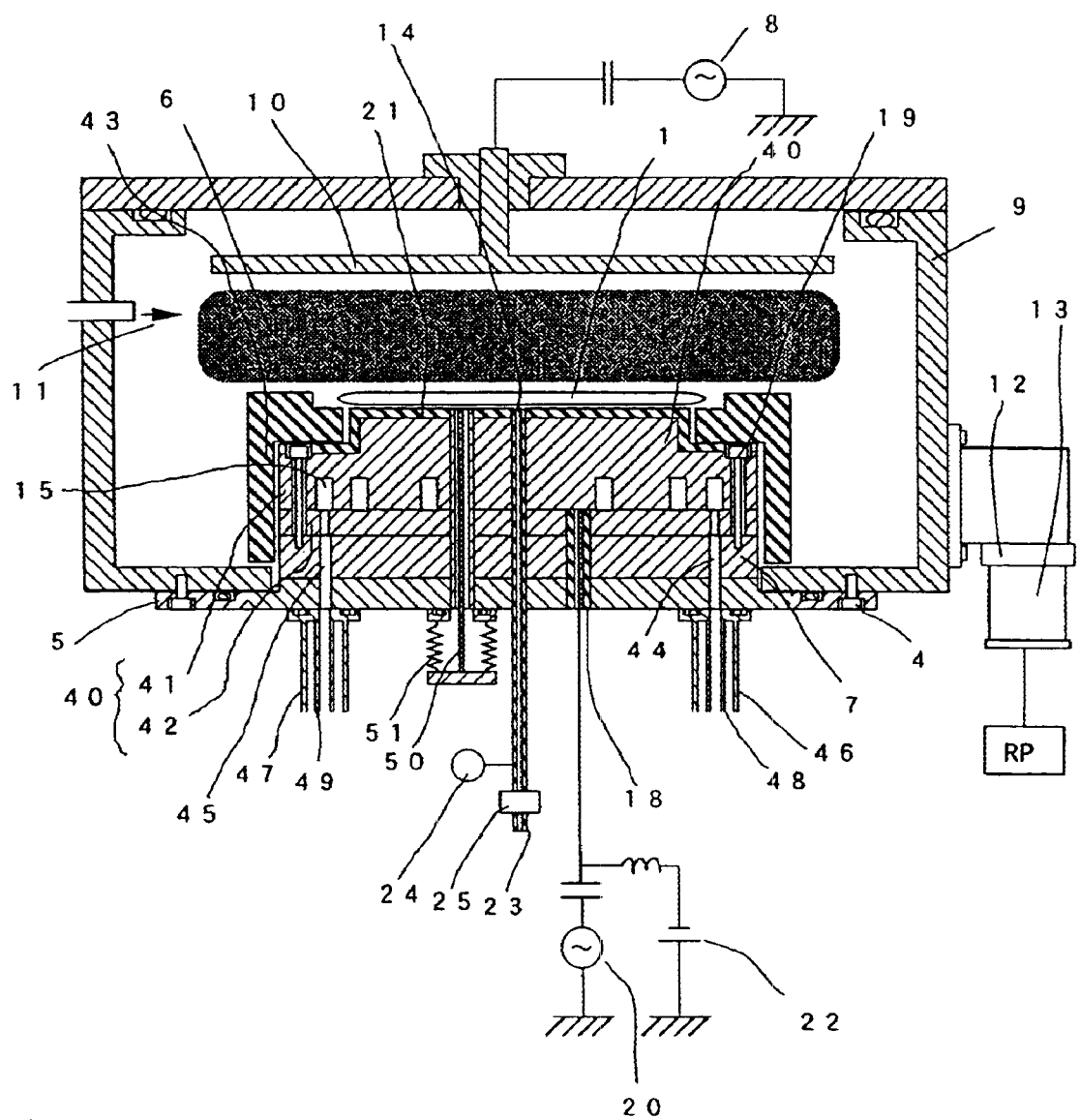
FIG. 9 is a sectional view illustrating an example of a prior art wafer processing apparatus.
Figure 10:
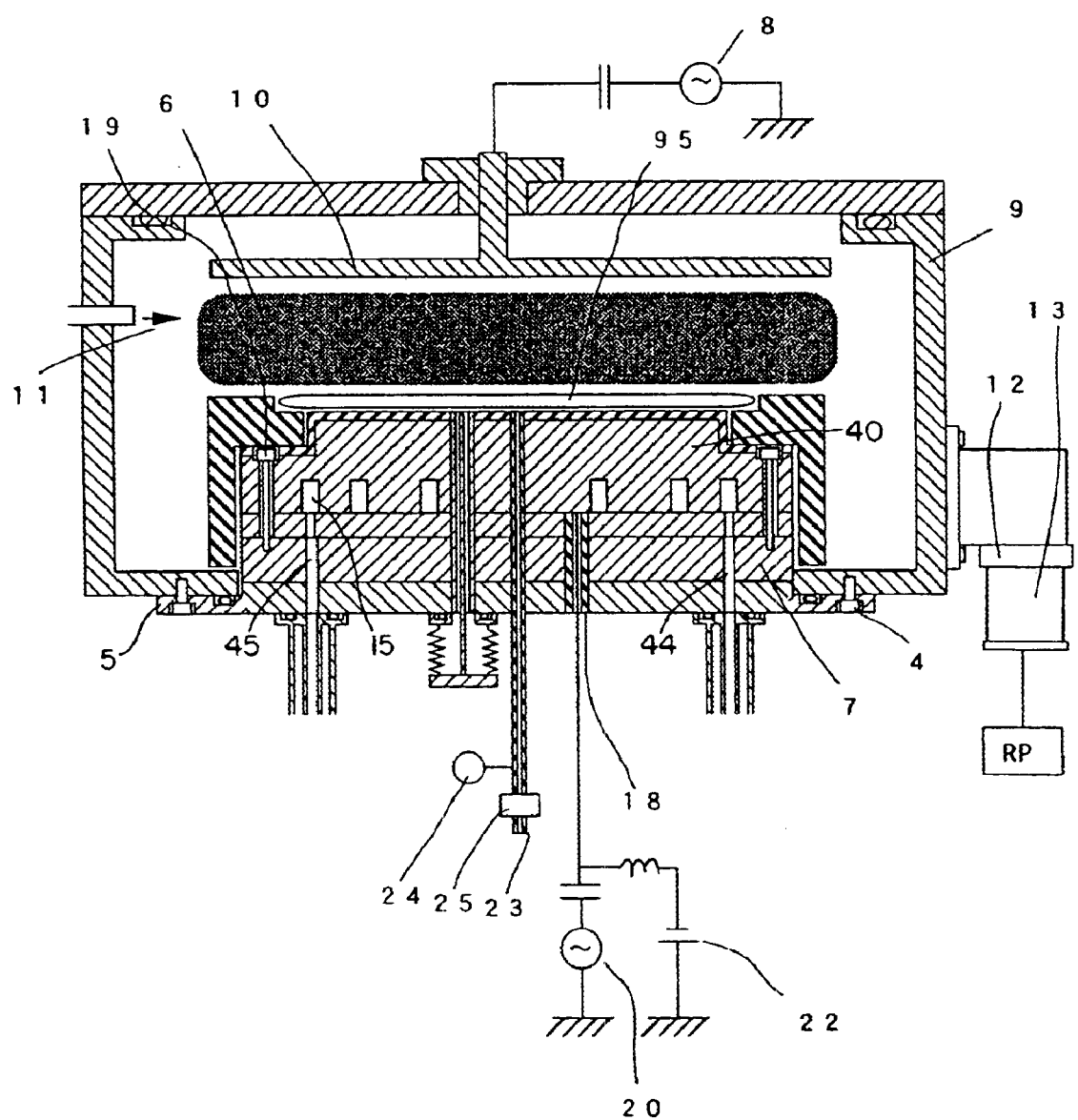
FIG. 10 is a sectional view illustrating another example of prior art wafer processing apparatus.

Explanation will be hereinafter made of embodiments of the present invention with reference to the accompanying drawings. At first, FIGS. 1 to 5 show a first embodiment in which the present invention is applied for a 12 inch wafer which is denoted by reference numeral 95 in this case, in order to distinguish it from a 8 inch wafer 1. Further, FIG. 1 is a sectional view which shows a wafer processing apparatus in its entirety, FIG. 2 is a longitudinal sectional view which shows a wafer stage in the processing apparatus shown in FIG. 1, FIG. 3 is a view which shows the wafer stage in the processing apparatus shown in FIG. 1, as viewed from above; FIG. 4 is a view which shows the wafer stage in the processing apparatus shown in FIG. 1, as viewed from below: and FIG. 5 is a cross-sectional view which shows the wafer stage in the processing apparatus shown in FIG. 1. It is noted that a wafer stage is denoted by reference numeral 52 in this embodiment, but the mechanism for generating plasma, including wafer processing steps and the exhaust device are the same as those in the prior art technology which has been explained with reference to FIGS. 9 and 10, and accordingly, explanation thereto will be omitted.

Further, at first, the wafer stage 52 in this embodiment, as shown in FIG. 2, is formed of an aluminum base 54 which is brazed to an aluminum lower cover 53 and is formed by spray-coating over the outer surface thereof with a dielectric film having a thickness of 1 mm and composed of ceramic as a main component.

Further, a step-like convex zone having a diameter of 290 mm is formed on the wafer holding surface side of the base 54, and accordingly, in a condition in which the wafer 95 is held, the wafer 95 overhangs by 5 mm from each side thereof.

Figure 12:
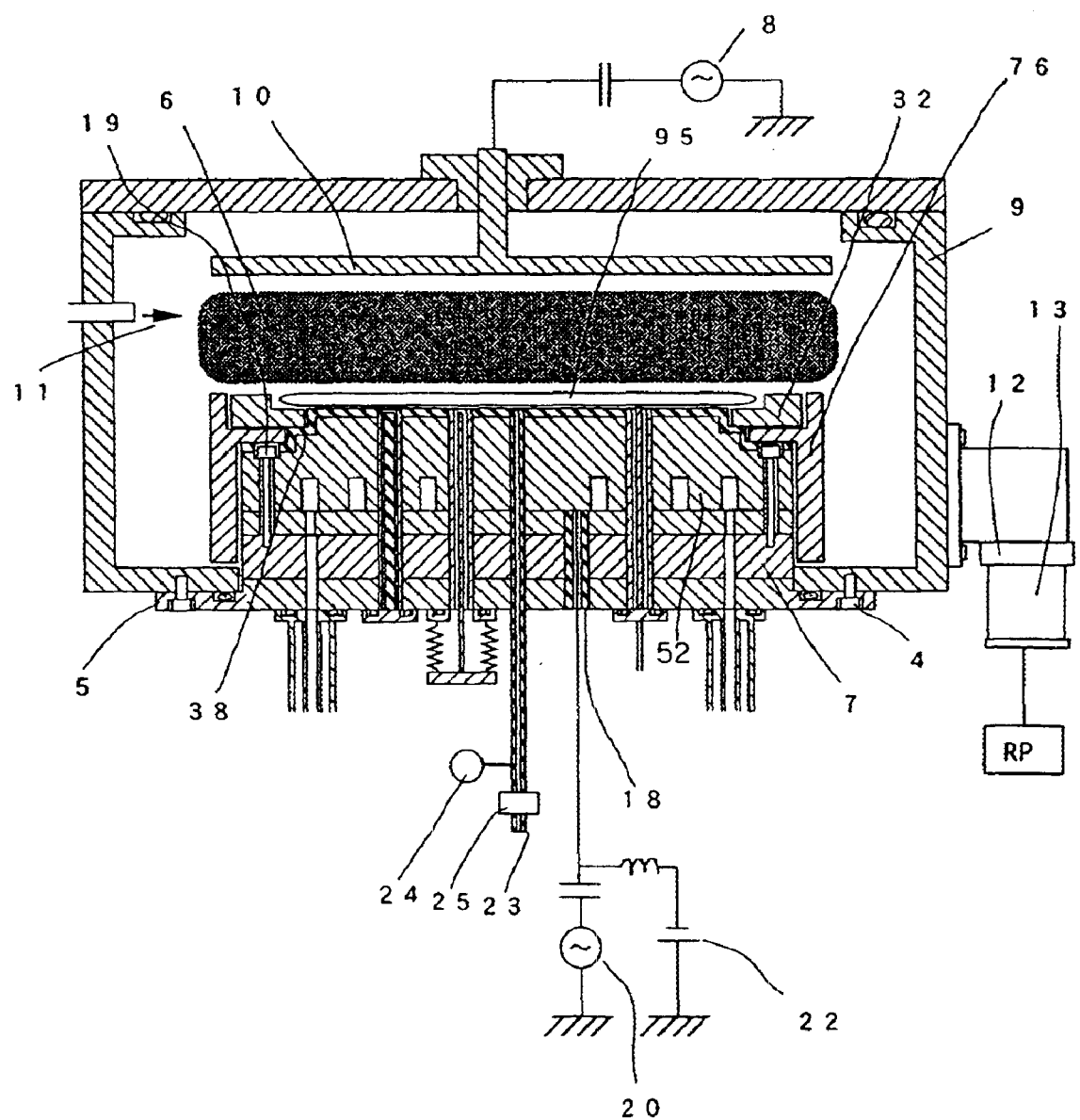
FIG. 12 is a sectional view illustrating a third embodiment of a wafer processing apparatus according to the present invention.

In this arrangement, the outer diameter of the wafer stage 52 is 320 mm, and a ceramic susceptor 28 which is the same as that of the prior art technology explained with reference to FIG. 12 is attached. Further, as shown in FIG. 3, at eight circumferential positions with a diameter of 310 mm, screw holes 26 for fixing the wafer stage 52 to an insulating member 7 are formed, and these screw holes 26 are formed with counterbores in order to avoid protrusion of heads of bolts therefrom.

Further, as shown in FIG. 3, concentric attracting zones 56, 57, 58, 59 which are arranged outward from the center in the mentioned order, and gas grooves 60 which are radially extended, for guiding heat transmission medium from the through hole 14 at the center to the outer peripheral part of the wafer stage are formed in the outer surface of the wafer stage 52.

It is noted that the gas grooves 60 have a width of 2 mm and a depth of 0.5 mm in this embodiment. However, the reason why the gas grooves are formed is such as to allow the heat transmission medium to propagate around the outer periphery, and accordingly, the above-mentioned dimensions are not essential. Referring similarly to FIGS. 2 and 3, there are shown holes 61 for pusher pins formed at three positions with a diameter of 100 mm, which are on a concentric circle, and probe through-holes 62, 63 for introducing thereinto a thermometer for measuring a temperature of the wafer, and a high voltage probe for measuring a voltage on the wafer, which are formed at two positions with a diameter of 150 mm.

Further, in the embodiment shown in FIG. 1, a fluorescent thermometer 64 for monitoring a temperature of the wafer during processing is provided in one of the through-holes, and a dummy plug 65 made of an insulation material is embedded in the other one of the through-holes since it is not required in this embodiment. With this arrangement, a wafer monitor probe which is not usually required may be simply incorporated as required, thereby it is extremely convenient.

Next, Referring to FIG. 4 which is a view showing the rear side of the wafer stage shown in FIG. 2 after removal thereof, there are shown an introduction port 66 and a discharge port 67 for coolant which are communicated with the temperature adjusting grooves (passages for coolant) formed in the wafer stage 52, and which are formed at positions with the diameter of 280 mm.

Next, referring to FIG. 5, explanation will be made of the temperature adjusting grooves 15 formed in the wafer stage 52. In FIG. 5 which shows the surface of a base 54 after a lower cover 53 is separated from the base 54 at a position where they are brazed together, as shown in FIG. 2, it is understood that coolant which has been introduced from a coolant source point 68 is bifurcated into two directions by the temperature adjusting grooves 15, and then flows toward the inner periphery. Then, the branch streams are finally merged again into a single stream before a final point 69, and then, the coolant is discharged.

It is noted that the coolant led through the temperature adjusting grooves 15, but in order to raise the temperature of the wafer state to a high temperature, the coolant having a high temperature is led through the temperature adjusting grooves 15, and in this case, the coolant serves as temperature adjusting medium.

It is noted that although the concentric three temperature grooves are provided in order to allow the coolant introduced from a position having a distance of 140 mm from the center to be discharged on the opposite side at positions having the equal distance from the center in this embodiment, the number of the temperature adjusting grooves should not limited to three but any number of the grooves may be formed. However, in the case of the provision of an odd number of concentric temperature adjusting grooves as is in this embodiment, the introduction port and the discharge port for coolant may be provided on opposite sides of the center, thereby it is convenient in view of designing.

Naturally, due to the convenience for the positions at which the above-mentioned probes are embedded, it is not required to concentrically lay the temperature adjusting grooves. It is clear that the configuration thereof may be suitably determined in view of positions of component parts such as pusher pins and probes even though an even number of the temperature adjusting grooves are formed.

It is noted that organic solvent having high electrical insulation is often used in general as the temperature adjusting medium (coolant), and in this case, the flow rate thereof is about 0.5 to 10 liters per min. A higher flow rate is desirable in order to enhance the heat conduction between the temperature adjusting medium and the base, but this flow rate is inevitably determined by a capacity of a pump incorporated in a temperature adjusting unit for circulating the temperature adjusting medium.

Figure 6:
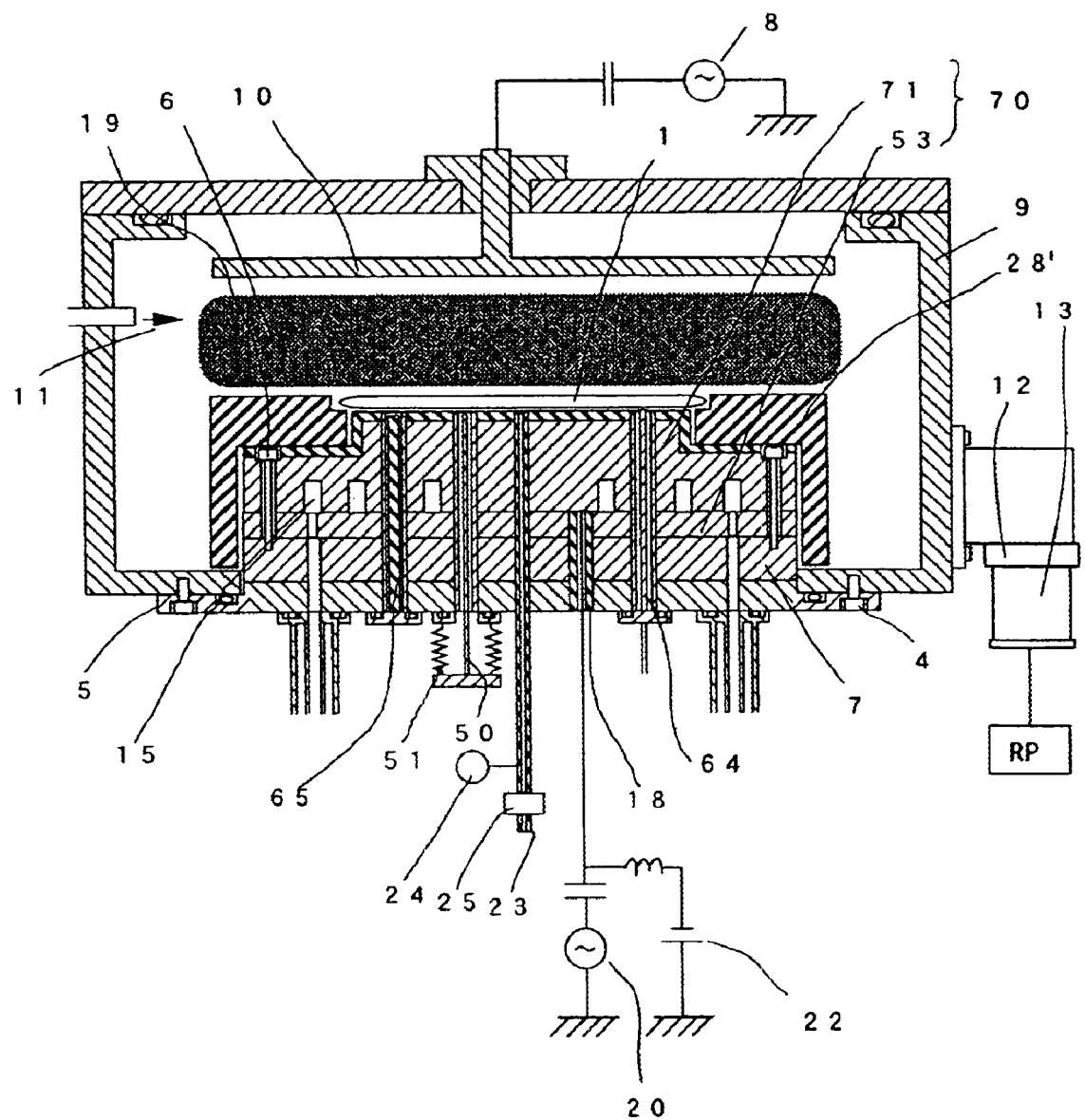
FIG. 6 is a sectional view illustrating another example of the first embodiment of the wafer processing apparatus according to the present invention.
Figure 7:
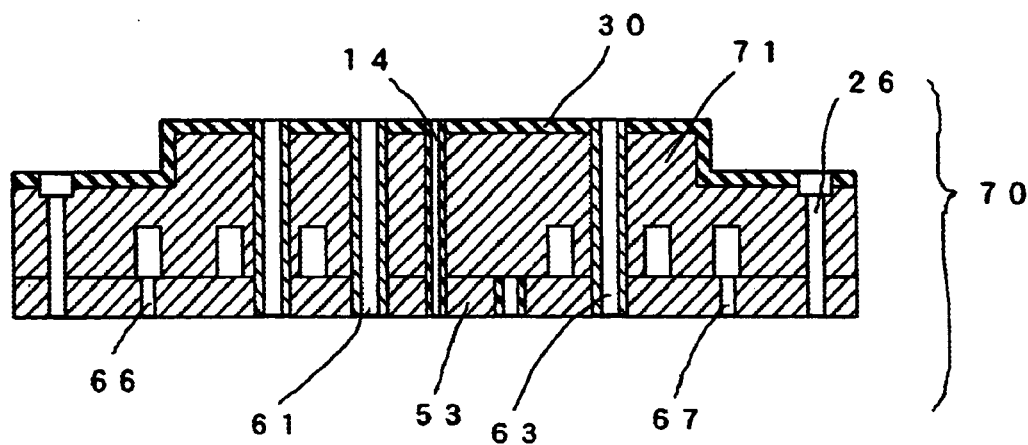
FIG. 7 is a sectional view illustrating a wafer stage in another example of the first embodiment of the present invention.
Figure 8:
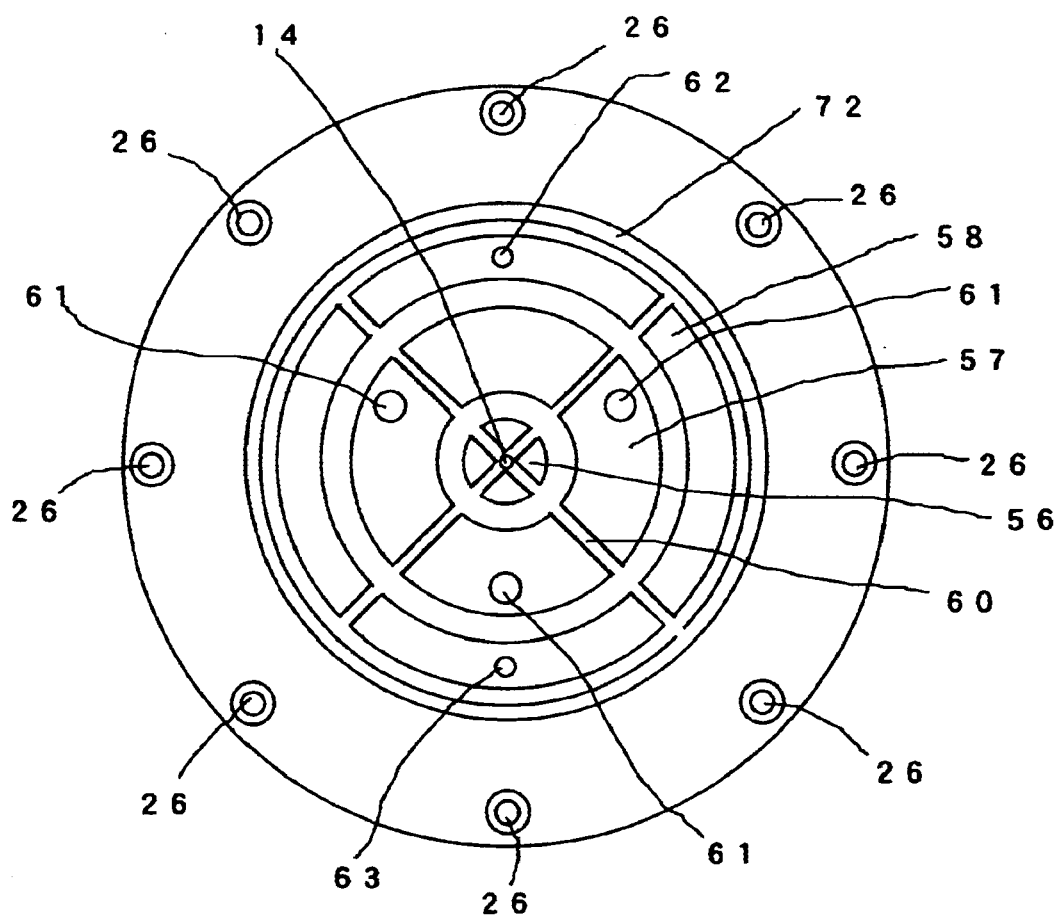
FIG. 8 is a front view illustrating a wafer stage in another example of the first embodiment of the present invention.

Next, referring to FIGS. 6 to 8 which also show the first embodiment of the present invention in the case of application for a 8 inch wafer, FIG. 6 is a sectional view which shows a wafer processing apparatus in its entirety, FIG. 7 is a longitudinal sectional view which shows a wafer stage in the processing apparatus shown in FIG. 6, and FIG. 8 is a view which shows the wafer stage in the processing apparatus shown in FIG. 6, as viewed from above.

It is noted that the configuration of the embodiment shown in FIGS. 6 to 8 is the same as that of the wafer processing apparatus which is shown in FIG. 1 and which is applied for a 12 inch wafer, except the wafer stage denoted by reference numeral 70 and a susceptor denoted by 28'. Specifically, as shown in FIG. 7, the wafer stage 70 in this embodiment is formed of a base 71 basically having the same dimensions as that of the base 54 in the embodiment for a 12 inch wafer, as shown in FIGS. 2 to 5, except that the convex part for carrying thereon a wafer has a diameter of 190 mm.

Accordingly, in the embodiment shown in FIGS. 6 to 8, as the diameter of the convex part for carrying the wafer thereon is decreased, the diameter of a circular exposed part of the susceptor 28' made of ceramic is increased, and further, of the attracting zones 56, 57, 58, 59 shown in FIG. 5, the outermost peripheral one 59 is set to an attracting zone 72 having a decreased diameter, as shown in FIG. 8, but the structure thereof is not basically changed. It is the same in view of such a point that base 54 is covered over its outer surface with the dielectric film 30 having a thickness of 1 mm and formed of ceramic, as a main component, by spray coating, and such a point that the lower cover 53 is composed of the same component parts in the embodiment for a 12 inch wafer shown in FIGS. 2 to 5.

Accordingly, according to the first embodiment of the present invention shown in FIGS. 1 to 8, either of the wafer stage 52 and the wafer stage 70 can be at once removed from the insulation member 7 only by removing the susceptor 28 or the susceptor 28' covered on the wafer stages 52 or 70, respectively, therefrom, and then removing the bolts 19, and accordingly, it can be simply removed from the vacuum chamber 9. On the contrary, either of the wafer stage 52 and the wafer stage 70 can be simply installed in the vacuum chamber 9 only by inserting and fastening the bolts 19 thereinto and then covering the susceptor 28 or the susceptor 28' thereon after it is set on the insulation member 7.

Accordingly, with the configuration of the first embodiment, the wafer stage 52 for a 12 inch wafer and the wafer stage 70 for a 8 inch wafer can be simply replaced with each other, and as a result, only with the provision of the wafer stage 52 and the susceptor 28 for a 12 inch wafer, and the wafer stage 70 and the susceptor 28' for a 8 inch wafer, the wafer processing apparatus can be at once suitably and simply used for a wafer having either 12 inch or a 8 inch wafer, thereby it is possible to sufficiently reduce the costs.

That is, with the configuration of this embodiment, since the wafer stage can be separated from a structure (the insulation member 7 in this embodiment) for securing the wafer stage, and since the positions and the structures of the component parts with which alignment is required between the different wafer stages, such as the means for securing the wafer stage, for example an electrical connection structure and a wafer transfer mechanism, the cooling structure for the wafer stage, the introduction port for cooling gas, the monitor probes are commonly used, the replacement of the wafer stages can be made in a short time, thereby it is possible to simply cope with a change between the sizes of wafers at a low cost.

In view of the stand-point of an apparatus manufacturer, with the configuration of the embodiment of the present invention, no redesigning is required for each of diameters of wafers to be processed, the burden upon the designers can be reduced, thereby it is possible to restrain the labor cost for the designers. Thus, it is possible to lower the manufacturing costs. Further, since the number of component parts to be managed can be reduced, it can be offered such an advantage that the stock components which should be reserved in the firm can become less, and since the number of component parts is less, any trouble caused on the client side can soon be solved, thereby it is possible to contribute to the acquirement of clients.

Next, in view of the stand-point of the user, the configuration of the embodiment of the present invention can offer such an advantage that the costs for introduction of the apparatus can be decreased, and the size of wafers can be simply changed. That is, if the user who owns a processing device for wafers having a certain size desires to process wafers having a different diameter, being caused by development of a new device, a new apparatus has to be purchased or improve the processing apparatus now owned. With the prior art technology, it takes a long time until the apparatus is changed in order to cope with wafers having a different diameter even though it can be barely made. In the worst case, it is considered such a fact that the development of the device has to be held back.

On the contrary, according to the present invention including the configuration of this embodiment, it is only required to simply replace the wafer stage with another one, and it is possible to simply cope with wafers having a different diameter in a short time. Further, as to other technical effects and advantages, only a short time is required for replacement of component parts, as previously explained as to the advantages of the apparatus manufacturer.

Further, in view of the stand-point of a wafer stage manufacturer, the relationship of take-up of the wafer stage corresponding to the apparatus manufactures can be made in one and the same way in the case of this embodiment, and accordingly, there may be raised such an advantage that the change of drawings among wafer sizes can be facilitated so as to reduce the burden upon the designers.

It is noted that although the radial positions of the structure such as pusher pins, a coolant inlet or outlet are set to the same positions, it is not always necessary, but the position can be suitably changed in view of other required functions. That is, it is important here that the mounting positional relationship among the wafer stages is set to be common.

Further, in the above-mentioned embodiment, although concentric circular groove pattern is formed on the outer surface of the dielectric film having an electrostatic chuck function, but this pattern may not always be required. In view of the temperature distribution over the surface of the wafer and the method of manufacturing the dielectric film, another optimum pattern can be used. Further, as to the pattern of the coolant grooves, the coolant grooves have two concentric branch systems, but this configuration is not always essential.

It is important to design the wafer stage so as to make the temperature distribution over the wafer appropriate, and in view of the present invention, the mounting positional relationship among wafer stages is common which can cope with wafers having different diameters.

Further, in the above-mentioned embodiment, although the dielectric film is formed by spray coating, it is not always essential, but a sintered material may be brazed or applied by adhesive. Alternatively, it may be formed of a film made of ceramic as a main component and formed by a chemical vapor growth process.

By the way, in the first embodiment of the present invention as mentioned above, although explanation has been made of such a case that the wafer stage has an electrostatic chuck function, an embodiment in which the function of the wafer stage is different will be explained hereinafter. At first, FIG. 11 shows a second embodiment of the present invention, which is different from the wafer stage in the processing apparatus for wafers having a 12 inch diameter, and in which no electrostatic chuck function is incorporated in a wafer stage 73.

However, even in this embodiment, since it is required to control the temperature of a wafer on processing, the temperature grooves 15 are formed in the wafer stage 73, similar to the first embodiment, and temperature adjusting medium (coolant) is circulated therethrough.

Further, cooling gas is introduced to the rear surface of a wafer 95 also in this embodiment. Accordingly, in order to prevent the wafer 95 from being shifted by the pressure of the cooling gas, a clamp 74 is used to constrain the wafer 95 around its outer periphery in order to secure the wafer 95.

Figure 11:
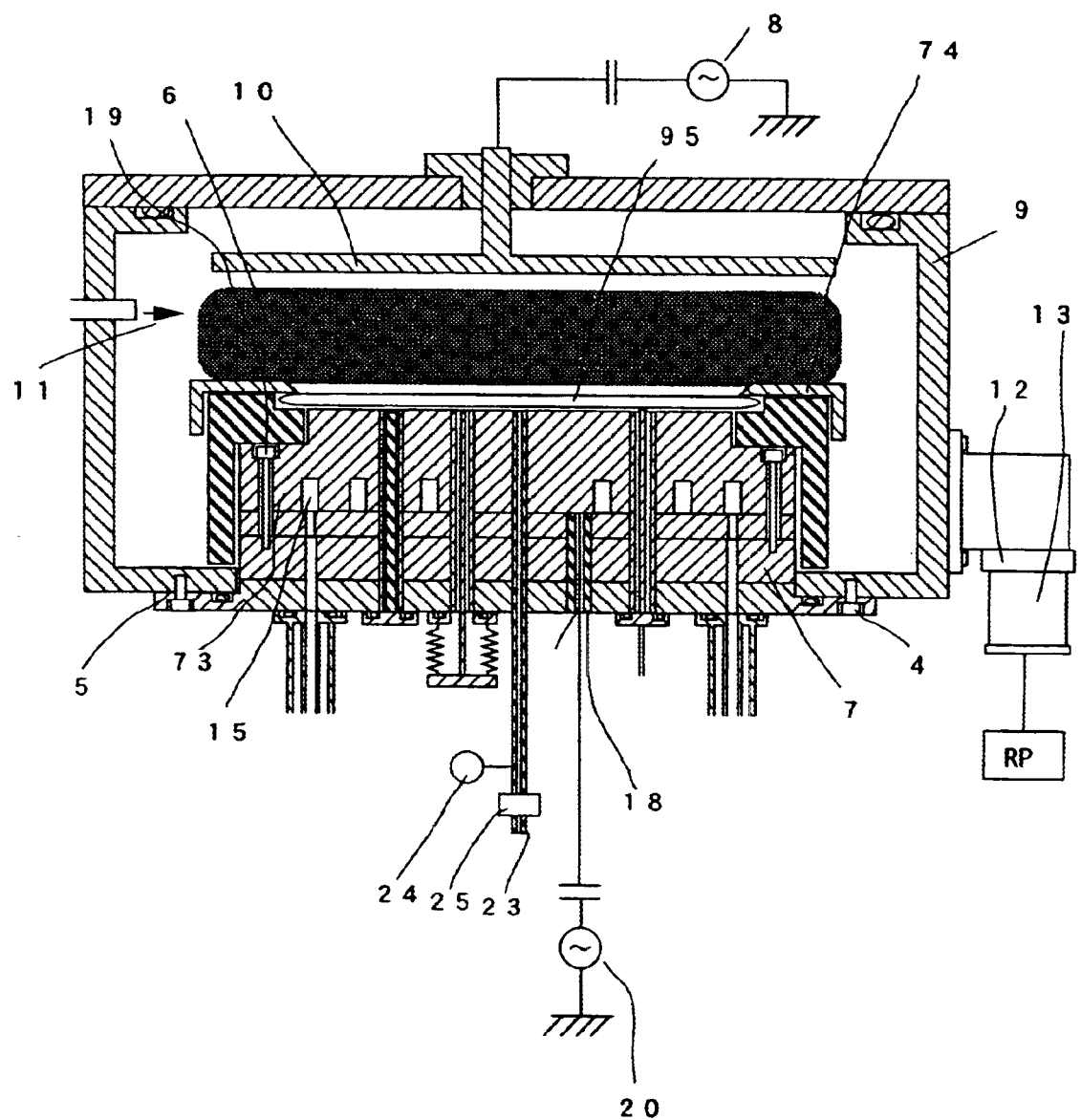
FIG. 11 is a sectional view illustrating a second embodiment of a wafer processing apparatus according to the present invention.

It is noted that although a D.C. voltage is applied to the lower cover in the first embodiment, it is not required in the embodiment shown in FIG. 11. The other configuration is the same as that of the first embodiment.

Accordingly, as to an advantageous point obtained by the second embodiment shown in FIG. 11, the formation of the dielectric film on the outer surface of the wafer stage 73 is not required, and a D.C. power source for the electrostatic chuck is not required. Accordingly, the configuration of the apparatus is simplified, and it is possible to reduce the costs. On the contrary, in comparison with such a case that a usual electrostatic chuck is used, the temperature distribution tends to deteriorate more or less, and accordingly, this processing apparatus is effective in a process in which the heat input capacity to the wafer is small, or a process in which the thermal condition of the wafer is vague.

Further, even in the case of the second embodiment, a change from the processing apparatus in the first embodiment shown in FIG. 1 is caused only by the wafer stage, and accordingly, such an effect that the change of the wafer processing apparatus can be extremely simply made is not altered.

Next, referring to FIG. 12 which shows a third embodiment of the present invention, the third embodiment has such a configuration that a stepped part 38 is formed around the outer periphery of the upper part of the wafer stage 52 in the first embodiment, and a silicon ring 32 is set on the stepped part 38. Accordingly, the configuration of this embodiment is the same as that of the first embodiment, except that structure of the susceptor 76 is changed more or less in order to set the ring 32.

It is noted that ring 32 is the so-called focus ring, and accordingly, when plasma 6 is generated in the processing chamber (vacuum chamber 9) while a D.C. voltage is applied to the wafer stage 52 in a condition in which this ring 32 is provided, similar to the first embodiment, the ring 32 is electrostatically attracted similar to the wafer 95. In this condition, a bias power is introduced into the wafer stage 52, a bias potential is generated also in the ring 32, accelerated ions enters thereinto from the plasma 6.

This is an effective technique for making the etching characteristic uniform over the surface of the wafer, in the case of etching process for an insulation film with fluorocarbon plasma. The reason thereof is such that excessive fluorine radical in the plasma is removed, and accordingly, a plasma distribution which is uniform from the center to the outer periphery of a wafer can be materialized.

Accordingly, with the wafer processing apparatus in the third embodiment, in addition to the advantages which can be expected from the first embodiment, there may be expected such an effect that an uniform etching characteristic is obtained since not only the uniform wafer temperature can be ensured but also the focus ring (ring 32) can be cooled.

It is noted that although the ring 32 is made of silicon in the third embodiment, it may be made of another material such as carbon or silicon carbide (SiC).

Also in the configuration of the third embodiment, the change from the wafer processing apparatus in the embodiment shown in FIG. 1, is made by only changing the shapes of the wafer stage 52 and the susceptor 28 and by adding the ring 32, and accordingly, the wafer stage can be replaced with a wafer stage having a different function in an extremely simple manner, thus the wafer processing chamber can be changed at a low cost.

Figure 13:
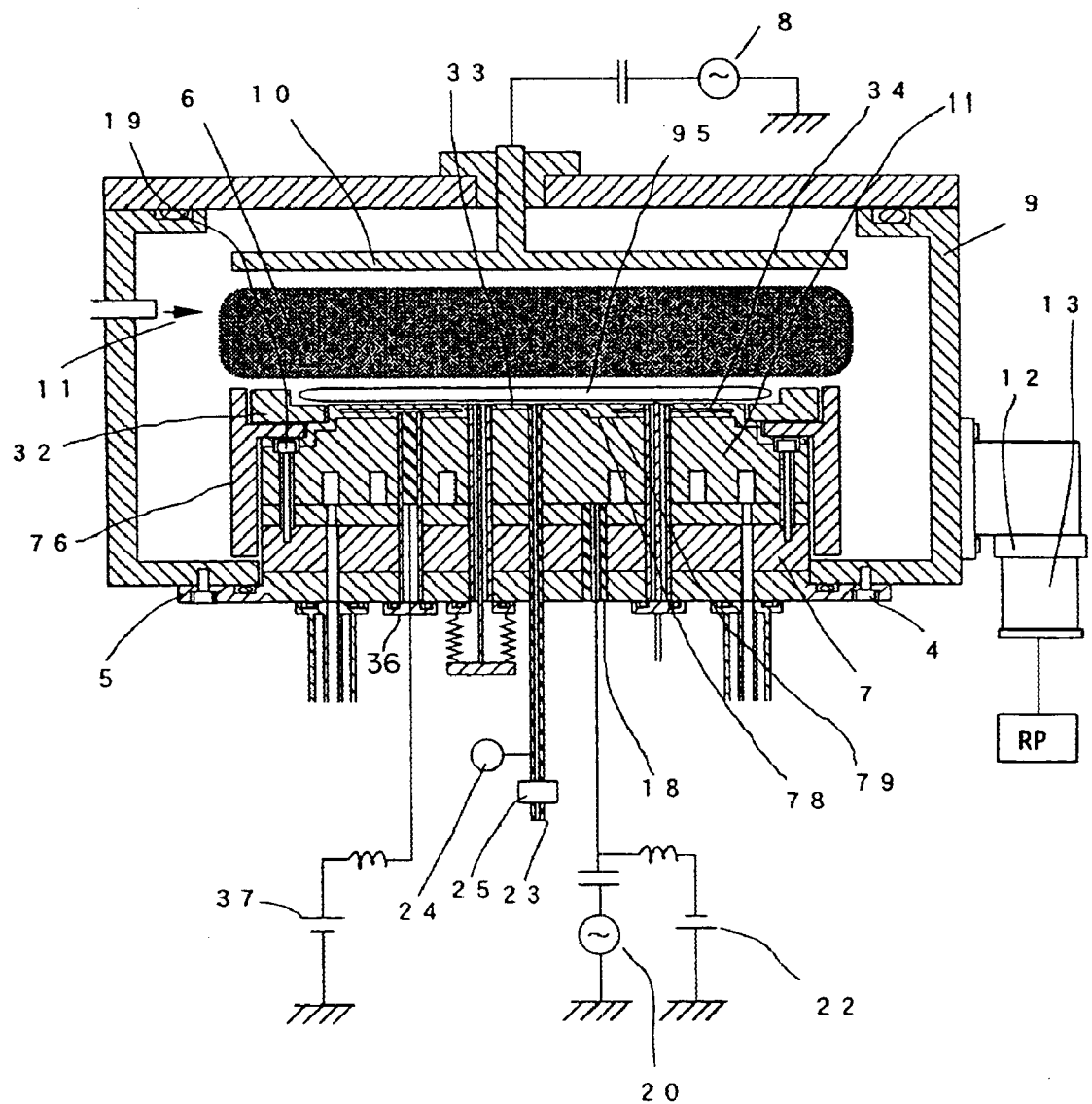
FIG. 13 is a sectional view illustrating a fourth embodiment of a wafer processing apparatus according to the present invention.

Next, referring to FIG. 13 which shows a fourth embodiment of the present invention, although the single electrode to which a D.C. voltage is applied is used as the electrostatic chuck provided to the wafer ring in the first and the third embodiments, that is, it is the so-called mono-pole type, the so-called bipolar type electrostatic chuck using two electrodes is installed in the embodiment shown in FIG. 13.

Thus, specifically, as shown in FIG. 13, the base 77 serving as the wafer stage 77 is formed around its outer periphery with a stepped part 78 which is lower than a part around its center, and an insulation layer 79 for electrically insulating from the base 77 is provided on the stepped part 78 while a ring-like internal electrode 34 made of tungsten is provided on the insulation layer 79. Further, a dielectric film 33 for attracting the wafer 95 is formed on the internal electrode 34 by spray coating.

Further, in this embodiment, the above-mentioned dummy plug 66 in the first embodiment is eliminated, and a plug 36 is provided instead thereof. Thus, a D.C. voltage is applied to the internal electrode 34 from a D.C. power source 37 externally provided, through the intermediary of this plug 36. At this time, the polarity of the D.C. voltage from the D.C. power source 37 is set to be opposite to the polarity of a D.C. voltage applied from the D.C. voltage 22. That is, in this case, since a D.C. voltage applied to the base 77 constituting the wafer stage has a negative polarity, as shown in the figure, a D.C. voltage having a positive polarity is applied to the internal electrode 34.

With this configuration, irrespective of the presence of the plasma 6, an electric circuit can be established through the intermediary of the wafer 95, and accordingly, the wafer 95 can be attracted before the plasma discharge is started while helium gas can be introduced in this fourth embodiment, thereby it is possible to control the temperature of the wafer just after the wafer process is started.

Accordingly, by applying the wafer stage according to the fourth embodiment to a wafer processing apparatus, a high performance processing apparatus which can further enhance the wafer temperature control ability can be provided.

Further, with the configuration of the fourth embodiment, a wafer can be mounted and removed, irrespective of the presence of the plasma, and accordingly, no waiting time for removal of charge applied to the wafer is required after completion of the process, thereby it is possible to obtain such an advantage that the through-put can be expected to be enhanced for processing a wafer.

Further, even in the case of the fourth embodiment, the change from the wafer processing apparatus in the first embodiment is made only by changing the shapes of the wafer stage 52 and the susceptor 28 and by adding the internal electrode 34, and accordingly, the wafer stage can be replaced with a wafer stage having a different function in an extremely simple manner, thereby it is possible to change the wafer processing apparatus at a low cost.

It is noted that the dielectric film 33 may be formed not only by spray coating but also by brazing a sintered material even in the fourth embodiment or attaching the same with an adhesive.

Further, in this embodiment, although the internal electrode has a ring-like shape, but it may have another shape.

Anyway, in the fourth embodiment, with the provision of a plurality of electrodes, it is important that a wafer can be mounted and removed, irrespective of the presence of the plasma.

Further, in this embodiment, although the polarities of the D.C. power source 22 and the D.C power source 37 are set to be opposite to each other, it is not always required to have opposite polarities. It is important to provide two electrodes, that is, to apply a potential difference between the base 77 and the internal electrode 34.

By the way, explanation has been made hereinafter of the embodiments in which the wafer stage is composed of the lower cover and the base provided in the upper part of the former. However, the present invention should not be limited to this configuration. Thus, explanation will be hereinafter made of embodiments having different configurations.

Figure 14:
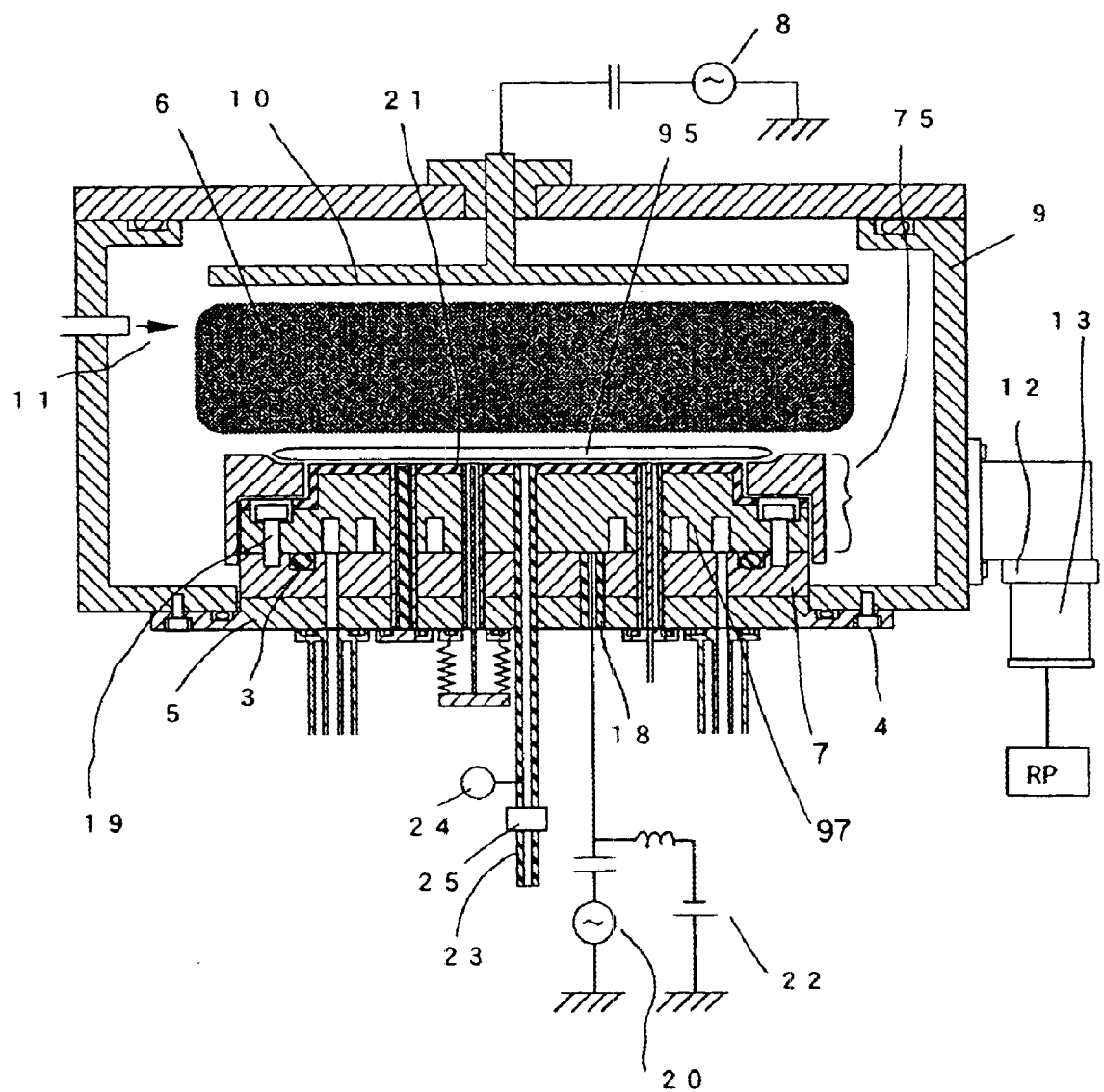
FIG. 14 is a sectional view illustrating a fifth embodiment of a wafer processing apparatus according to the present invention.
Figure 15:
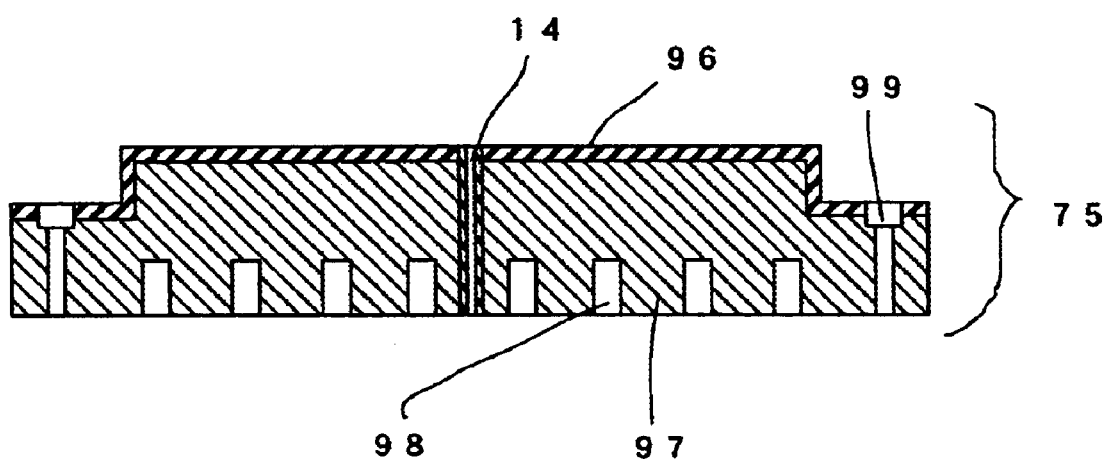
FIG. 15 is a sectional view illustrating a wafer stage in the fifth embodiment of the present invention.

At first, referring to FIGS. 14 and 15 which show a fifth embodiment of the present invention, the lower cover 53 provided in the first to fourth embodiments is eliminated from a wafer stage 75 in this embodiment, and the wafer stage 75 is formed only of a base 97 which is formed on its outer surface with a dielectric film 96 having a thickness of 1 mm. The other configuration thereof is similar to that of the first embodiment.

Temperature adjusting grooves are formed in the rear surface of the base 97, and further, bolt holes 99 each having a counter-bore are formed in the outer periphery thereof at circumferentially eight positions. With this arrangement, the base 97 is secured to the insulation member 31 with bolts 19. In this arrangement, an O-ring 3 is interposed between the insulation member 7 and the base 97 so as to prevent coolant from leaking into the processing chamber from the temperature adjusting grooves 98.

With the provision of the wafer stage 75 having the above-mentioned configuration, the necessity of the lower cover can be eliminated from the wafer stage in the first embodiment, and further the necessity of adhering the base and the lower cover to each other can be eliminated. Accordingly, it is possible to offer such an advantage that the manufacturing cost can be lowered.

Further, in the case of this embodiment, the change from the wafer processing apparatus in the embodiment shown in FIG. 1 is made only by changing the shapes of the wafer stage 75 and the insulation member 7, and accordingly, the wafer stage can be replaced with a wafer stage having a different function in an extremely simple manner, thereby it is possible to change the wafer processing apparatus at a low cost.

In the fifth embodiment, other than that mentioned above, there may be provided such a configuration that no temperature adjusting grooves are formed in the wafer stage 75, but the wafer stage 75 is cooled by a cooling jacket independent from the wafer stage.

Anyway, it is important in this embodiment that the wafer stage can be mounted and removed from the structure underneath thereof in a simple manner, and the mounting positional relationship between the wafer stage and another wafer stage having a different function is made to be common so as to facilitate the replacement thereof.

Thus, the explanation has been made of the typical embodiments of the present invention in which the wafer stage can be simply changed, and with this configuration alone, the function of the wafer processing apparatus can be simply changed. However, if, for example, the diameter of a wafer to be processed is changed, an improvement in the temperature distribution over the wafer would be sometime required. In particular, in an insulation film process in which a high capacity of a high frequency bias power applied to the wafer stage is required to have a high capacity, the heat input to the wafer is large, and accordingly, the temperature distribution causes a serous problem.

Thus, explanation will be hereinafter made of embodiments of the present invention, which are preferable for this case. It is noted that the technique for improving the temperature distribution which will be explained in the following embodiments is not limited to he first to fifth embodiments which have been already explained, as a premise, but it goes without saying that it can be carried out solely.

In other words, it goes without saying that the embodiments which will be explained hereinafter, are effective even for a wafer stage in a wafer processing apparatus specified for a wafer having a specific diameter but also a wafer stage having a specific function. However, it is not limited to this stage, but it is also effective if it is applied to the wafer processing devices in the first to fifth embodiments, and accordingly, it becomes a solving means for improving the temperature distribution of the wafer in an extremely simple manner.

Figure 16:
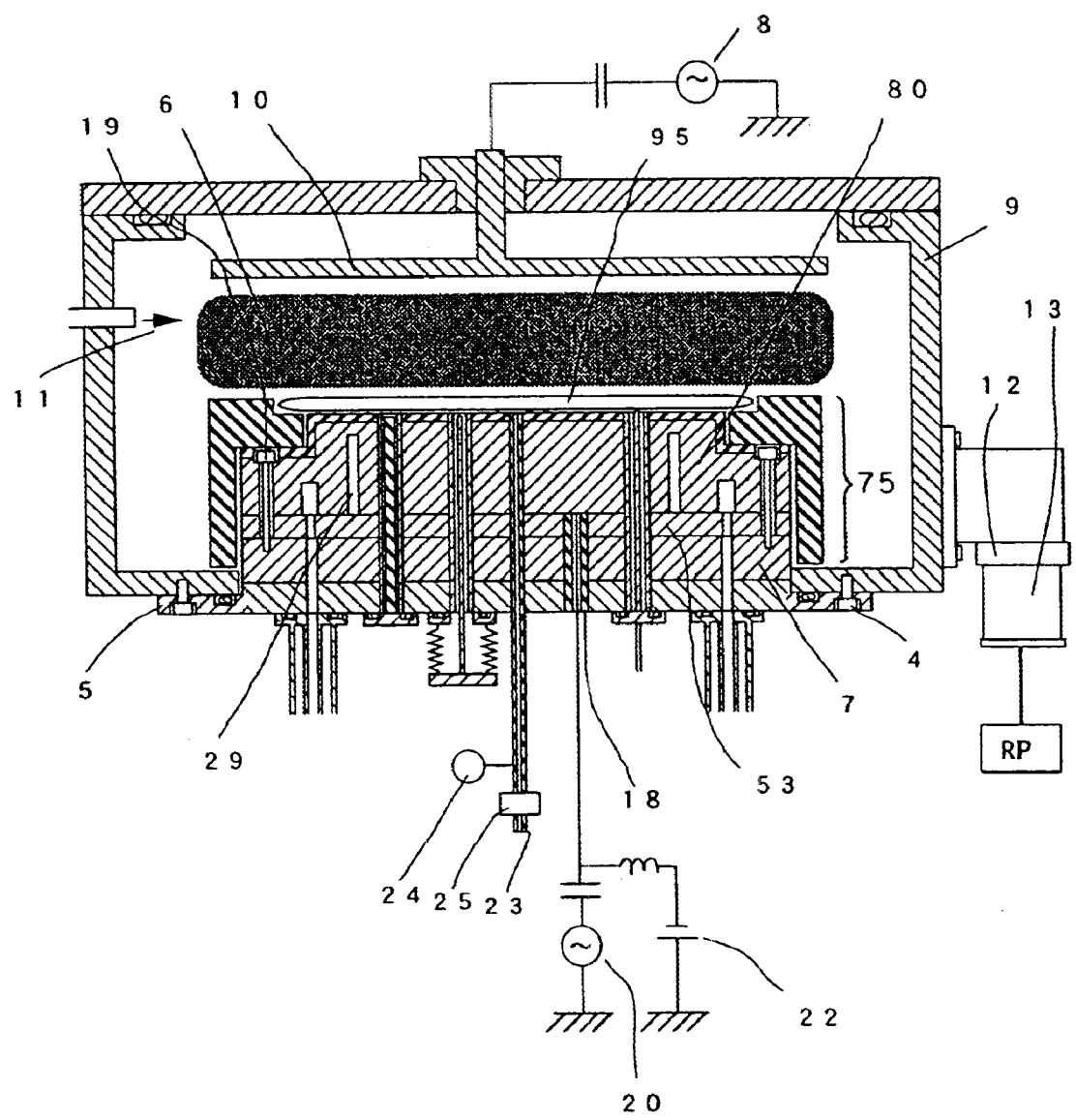
FIG. 16 is a sectional view illustrating a sixth embodiment of a wafer processing apparatus according to the present invention.
Figure 17:
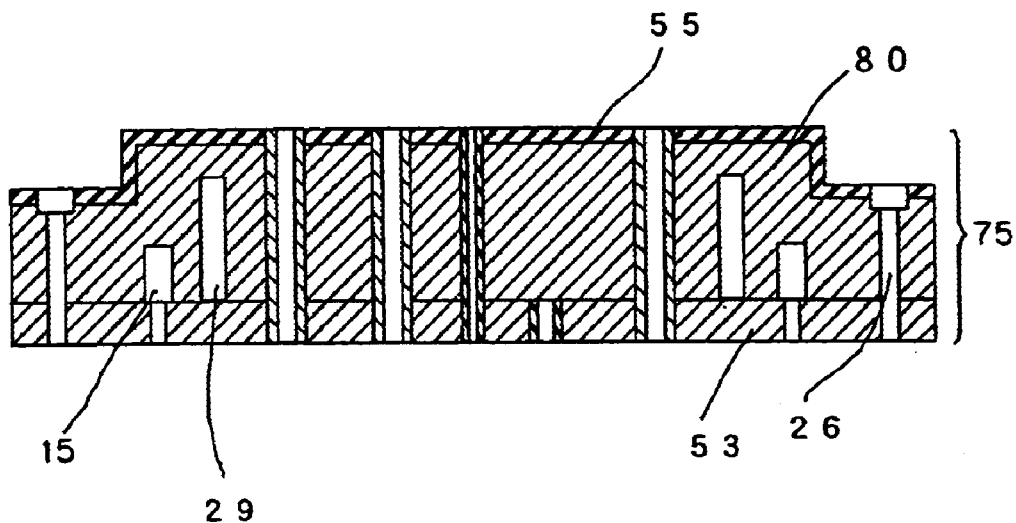
FIG. 17 is a sectional view illustrating a wafer stage in the sixth embodiment of the present invention.
Figure 18:
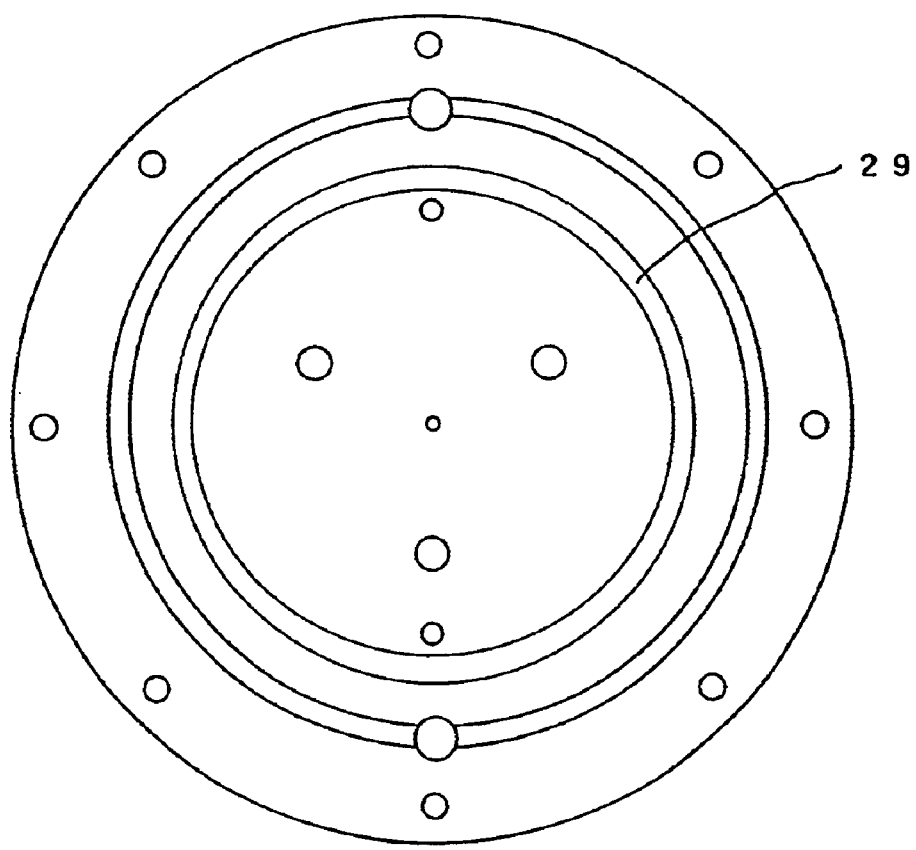
FIG. 18 is a rear view illustrating the water stage in the sixth embodiment of the present invention, which is viewed from a certain section of the wafer stage.

Referring to FIGS. 16 to 18 which shows a sixth embodiment of the present invention, a wafer stage in this embodiment is different from the wafer stage 52 in the first embodiment, that is, the wafer stage 75 is configured by forming an insulation groove 29 in a part of a base 80 attached to a lower cover 53, and a temperature adjusting groove 15 through which coolant flows, is formed only around the outer periphery of the heat insulating groove 29 in the base 80. Further, a dielectric film 55 having a thickness of 1 mm is formed on the outer surface of the base 80, similar to the first embodiment. Like reference numerals are used to denote like parts to those explained in the first embodiment, and accordingly, explanation thereto will be omitted.

The heat insulating groove 29 in this embodiment is formed as a hollow part which extends within the base 80, and is thereafter evacuated so as to effect vacuum therein. It is noted that the atmosphere around the base 80 and the lower cover 53 may be set to be vacuum for this purpose when they are brazed to each other. With this arrangement, heat inputted to the wafer 95 from the plasma 6 transmits to the temperature adjusting groove 15 through the base 80, and the temperature of a part around the center of the wafer is restrained from lowering, due to a large thermal resistance by the heat insulation groove 29 when the heat is exchanged by the coolant in the temperature adjusting groove 15. As a result, such a temperature distribution that the temperature around the center of the wafer becomes higher than the temperature in the vicinity of the outer periphery of the wafer is obtained.

That is, the object of this embodiment is to lower the temperature in the vicinity of the outer periphery of the wafer, relative to that of the temperature around the center thereof. This is because of the following reasons. That is, it is ordinally desired to lower the temperature in the vicinity of the outer periphery of the wafer in comparison with that in the inner periphery thereof during processing of the wafer, as in this embodiment. Accordingly, as so configured in this embodiment, the outer periphery of the wafer has often such a structure that it overhangs in comparison with the outer periphery of the wafer stage in order to restrain corrosion of the outer surface of the wafer stage by the plasma.

However, in this case, the cooling of the outer periphery of the wafer becomes insufficient so that the temperature in the vicinity of the outer periphery of the wafer becomes higher in comparison with the temperature of the inner periphery thereof. Accordingly, the cooling has to be sufficient in the outer periphery of the wafer in comparison with the center part thereof. This can be attained in the sixth embodiment by a simple configuration in which the heat insulation groove 29 is formed in the base 80, and accordingly, it is possible to simply improve the temperature distribution at an extremely low cost.

It is noted that the heat insulation groove 29 is constituted by a vacuum hollow zone in this embodiment. However, it is not necessary to constitute the heat insulation groove 29 from such a vacuum hollow zone, but it should be determined in view of a wafer temperature distribution which is desired to be materialized. Thus, a material having a heat conductivity which is lower than that of the base 80 may be embedded so as to form the heat insulation groove 29.

Further, this embodiment has such a structure that the heat insulation groove is isolated in the base 80, it may be opened in part so as to be communicated with the vacuum chamber 9. With this arrangement, the pressure in the heat insulation groove 29 becomes equal to the pressure in the processing chamber, that is, it becomes vacuum. Thereby it is possible to offer such an advantage that a wafer stage having a constant temperature characteristic can be obtained, irrespective of unevenness in the manufacture of the wafer stage.

By the way, although explanation has been made of such configuration that the temperature of the wafer is high in the vicinity of the outer periphery thereof in comparison with the temperature around the center thereof in this embodiment, it may be considered that the temperature of the wafer is lower in the center part thereof in comparison with the temperature in the outer peripheral part thereof. However, in this case, the temperature adjusting groove 15 may be arranged on the inside of the heat insulation groove 15. Accordingly, the positional relationship between the heat insulation groove 29 and the temperature adjusting groove 15 and the pattern thereof may be suitably determined in view of a required temperature distribution of the wafer. It should not be limited to this embodiment.

Figure 19:
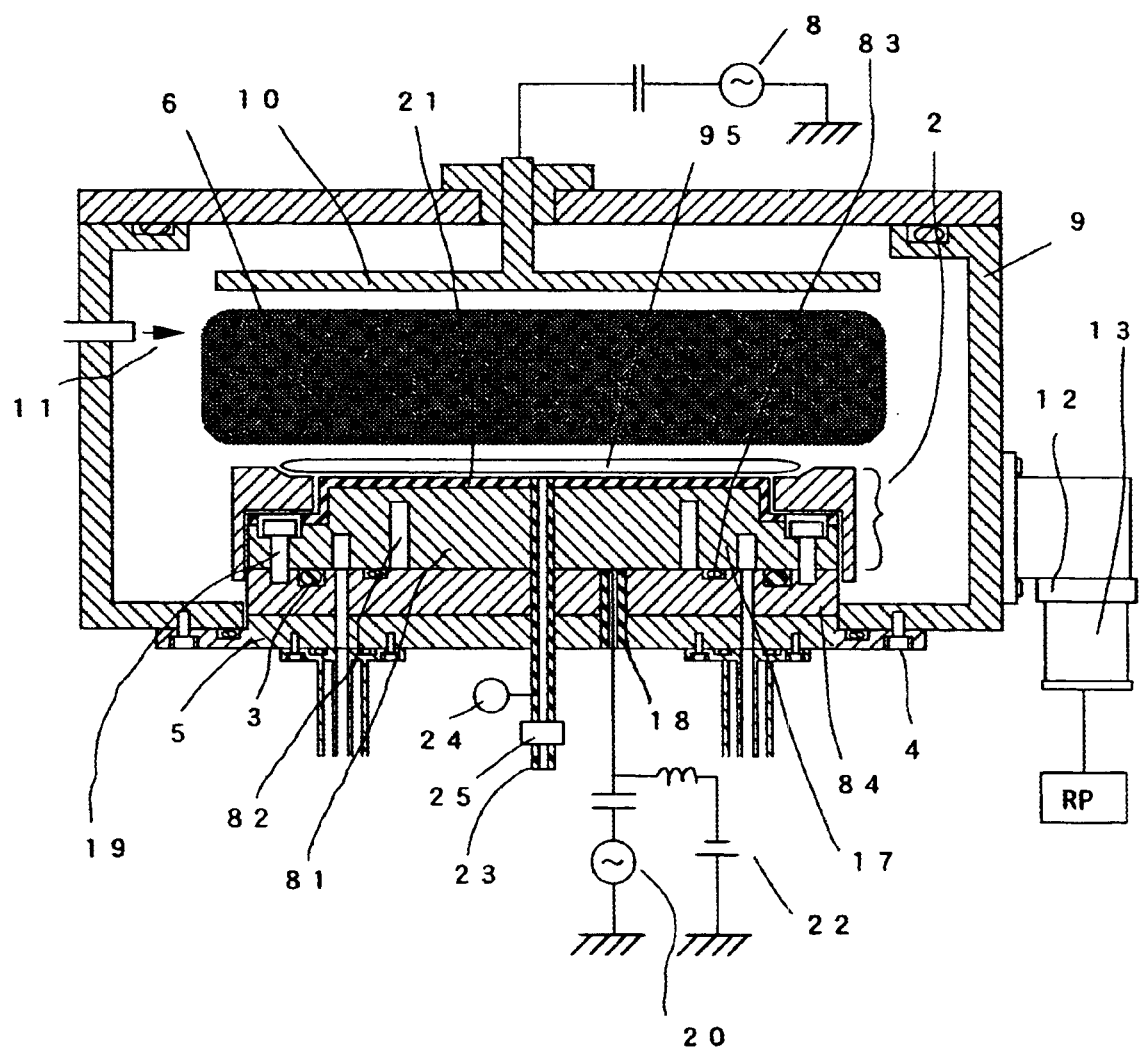
FIG. 19 is a sectional view illustrating a seventh embodiment of a wafer processing apparatus according to the present invention.

Next, referring to FIG. 19 which shows a seventh embodiment of the present invention, the idea of this embodiment is similar to that of the above-mentioned six embodiment. In this embodiment, only a wafer stage 2 is provided without the lower cover, and accordingly, an O-ring 83 is interposed between the wafer stage and an insulation member 7 in order to prevent coolant from leaking into a heat insulation groove 82 formed in the base 81 from the temperature adjusting groove 15. Accordingly, this seventh embodiment is constituted by applying the technique for improving the wafer temperature distribution in the sixth embodiment into the fifth embodiment.

Thus, even in the seventh embodiment, similar to the above-mentioned sixth embodiment, the temperature of the water can be decreased in the vicinity of the outer periphery thereof in comparison with the temperature around the center thereof even with such a simple structure that only the heat insulation groove 82 is formed in the water stage 2. Thereby it is possible to simply improve the temperature distribution at an extremely low cost. Further, since the seventh embodiment does not require the lower cover in the wafer stage 2, the number of component parts and the number of manufacturing steps can be reduced in comparison with the sixth embodiment, thereby it is possible to offer such an advantage that it can be materialized at a lower cost.

Figure 20:
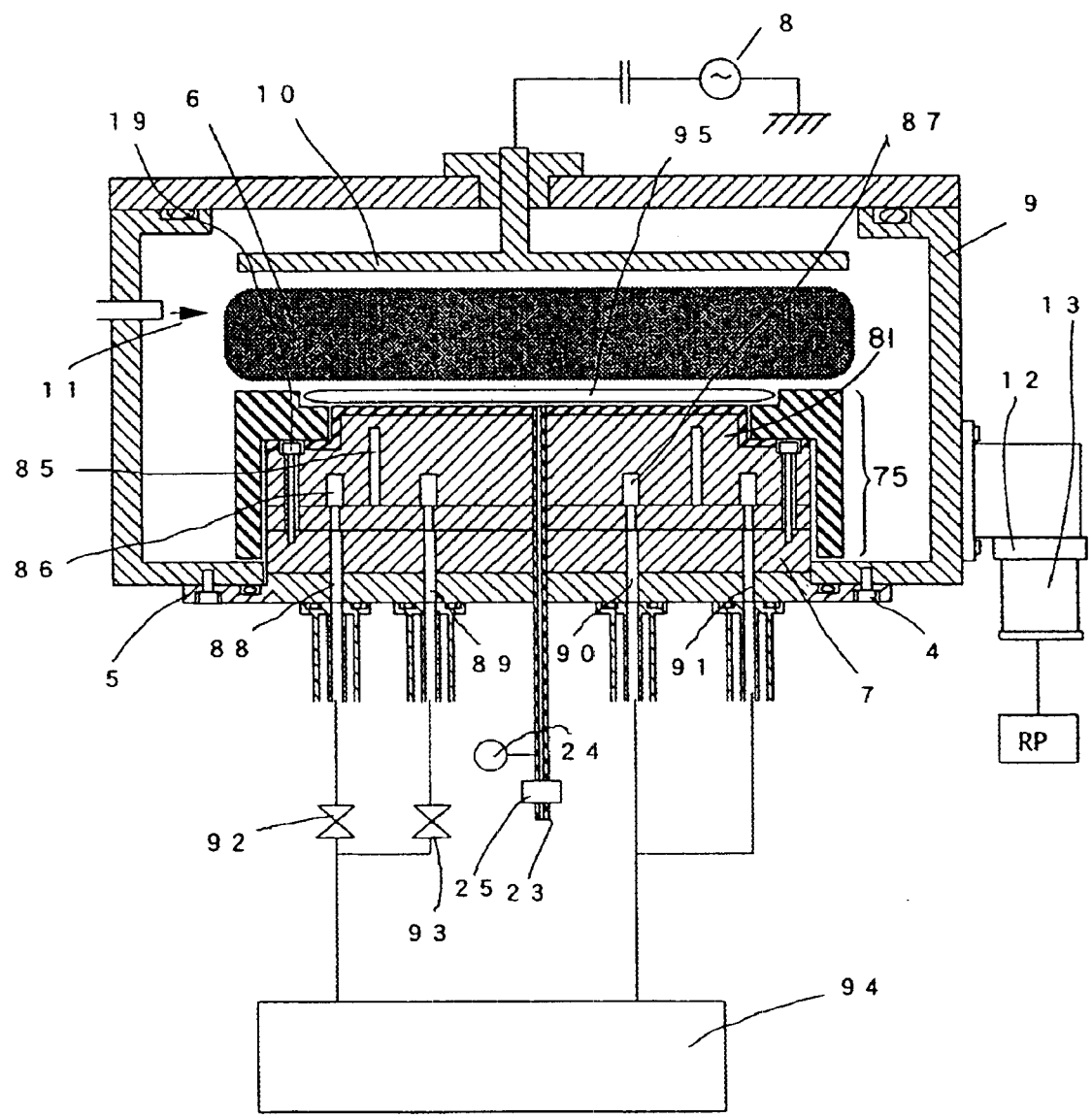
FIG. 20 is a sectional view illustrating an eighth embodiment of a wafer processing apparatus according to the present invention.
Figure 21:
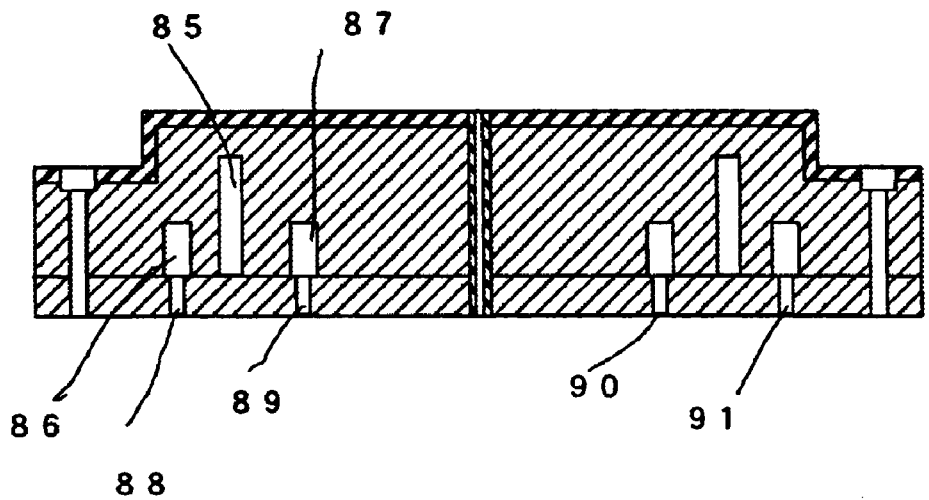
FIG. 21 is a sectional view illustrating a wafer stage in the eighth embodiment of the present invention.
Figure 22:
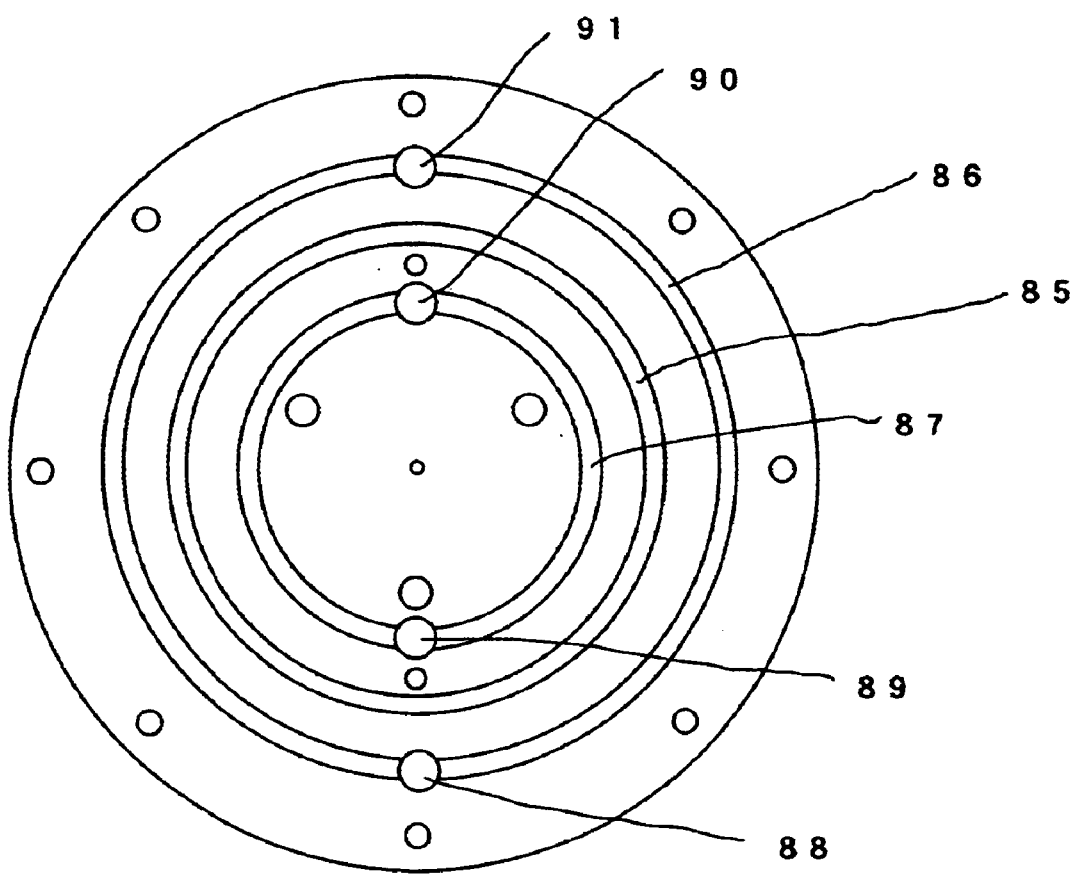
FIG. 22 is a rear view illustrating the wafer stage in the eighth embodiment of the present invention, which is viewed from a certain section of the wafer stage.

Next, explanation will be made of an eighth embodiment with reference to FIGS. 20 to 22. In this eighth embodiment, different from the sixth embodiment as mentioned above, temperature adjusting grooves 86, 87 are formed on the inside and the outside of a heat insulation groove 85, respectively, independent from as each other so as to constitute a base 81, and the temperature adjusting grooves 86, 87 are communicated thereto with introduction ports 88, 89 and discharge ports 90, 91, respectively. Further, the introduction ports 88, 89 are connected to a discharge port of the temperature adjusting groove 94 through the intermediary of valves 92, 93, and the discharge ports 90, 91 are connected to a return port of the temperature adjusting groove 94.

Accordingly, the flow rate of coolant circulated through the temperature adjusting grooves 86, 87 can be controlled, independent from each other by adjusting the opening degrees of the valves 92, 93, and accordingly, the temperature of the wafer around the center thereof, and the temperature in the vicinity of the outer periphery thereof can be controlled, independent from each other, thereby it is possible to obtain an optional temperature distribution For example, if it is desired that the temperature of the wafer is higher in the vicinity of the outer periphery thereof than the temperature around the center thereof, the flow rate of coolant circulated through the zone inside of the heat insulation groove 85 is set to be low but the flow rate of the coolant flowing through zone outside of the heat insulation groove is set to be high.

Thus, with the wafer processing apparatus in the eighth embodiment, the temperature of the wafer on processing can be simply changed, and accordingly, it is possible to provide a high performance wafer processing apparatus which has extremely satisfactory control ability for the temperature distribution of the wafer on processing.

At this time, in most cases, the flow rates of coolant flowing through the respective zones, are usually set to be in a range from about 0.5 to 10 liters per min. However, the combination of these temperatures should be determined so as to cause the temperature of the wafer to be optimum, and the maximum value of the flow rate can be determined by a capacity of a pump incorporated a temperature adjusting unit 94.

By the way, in the eighth embodiment, by adjusting the flow rates of the coolant flowing through the outside and the inside of the heat insulation groove 85 formed in the base 81 of the wafer stage 75, the temperature distribution over the surface of the wafer can be adjusted. In this method, only one temperature adjusting unit is required, and accordingly, although it is possible to offer such an advantage that the cost can be restrained from increasing, it would be insufficient if it is desired that the temperature distribution is changed largely.

Accordingly, in this case, the temperature adjusting grooves 86, 87 are provided with temperature adjusting units, independent from each other, and coolant is circulated through the temperature adjusting grooves in which the temperatures of the coolant are controlled so as to be different from each other. In this case, even though the cost becomes higher, the temperature of the wafer is more effectively adjusted.

It is noted that the plasma is generated in the parallel planar system. However, the present invention should not be always limited to this system. There may be used UHF plasma system, a microwave plasma system, a VHF plasma system and ECR plasma system. Naturally, in addition to these as mentioned above, it goes without saying that it may be applied to a magnetron type plasma processing apparatus using a magnetic field, and an inductively coupled type plasma processing apparatus.

Next, one embodiment of a wafer processing method according to the present invention will be explained with reference a flow-chart in FIG. 23. It is noted that explanation will be made of such a case that a wafer is processed in accordance with a temperature of the wafer on actually processing with the use of the wafer processing apparatus in the first embodiment of the present invention explained with reference to FIG. 1.

In this arrangement, the temperature of the wafer may be measured by using, for example, a floroptic thermometer or thermocouples, and in this case, explanation will be made of the measurement with the use of a fluorescent thermometer 64 as explained in the embodiment shown in FIG. 1.

Figure 23:
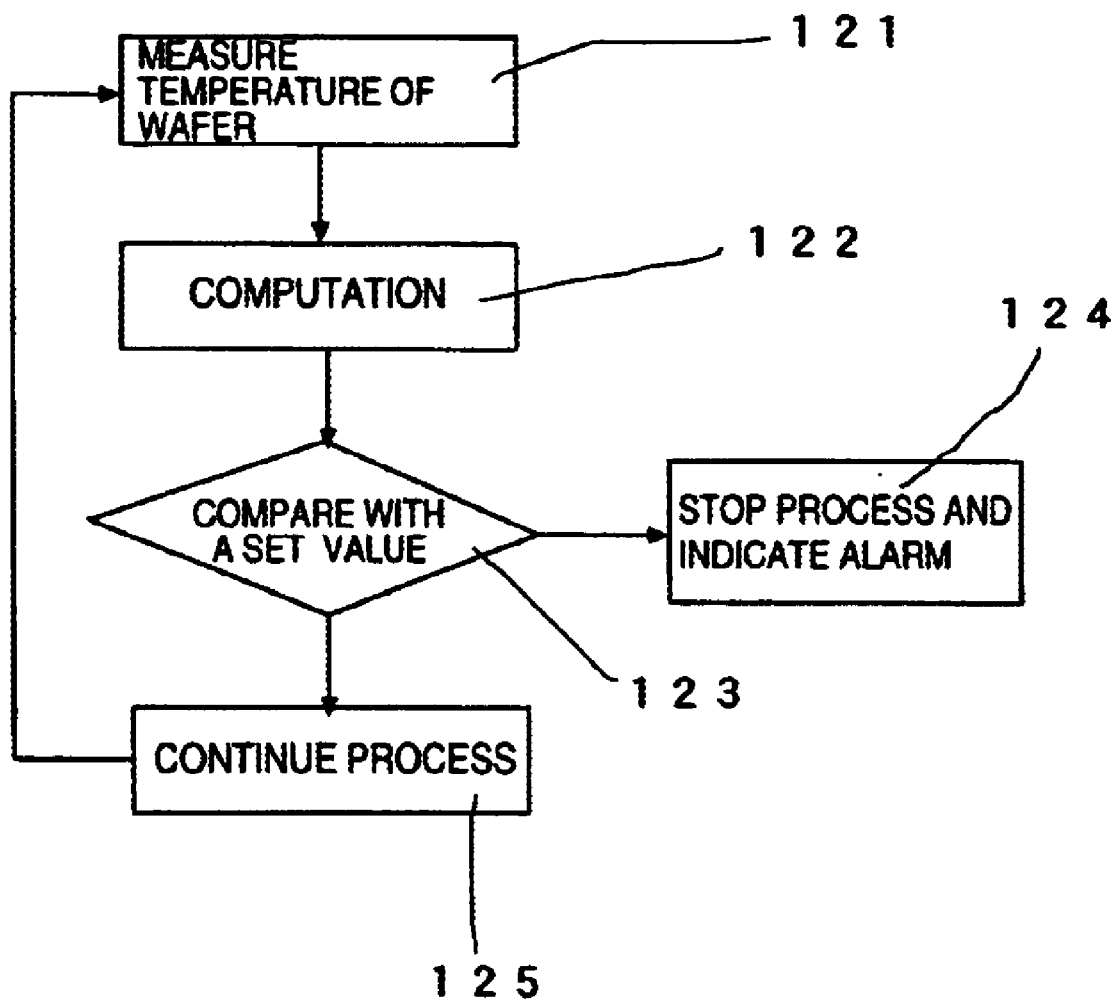
FIG. 23 is a flow-chart for explaining processing in an embodiment of a wafer processing method according to the present invention.

Referring to FIG. 23, a temperature of a wafer is at first measured (121). At this time, as mentioned above, a result of measurement can be obtained from the fluorescent thermometer 64 (FIG. 1). Next, the measured data is transmitted to a computer externally connected so as to carry out computation (122). Then, the temperature data is compared with a temperature range which has been previously set. With the result of the comparison, if it is determined that the processed condition is normal, the process is continued as it is (125), but if it is found that the processed condition is abnormal, the process is interrupted and indication of detection of the abnormality is concurrently indicated at a place which can be easily recognized by a worker, such as a computer display or the like (124).

Accordingly, with this processing method, if an abnormality is caused during processing of a wafer, it can rapidly cope therewith, and as a result, it is possible to prevent occurrence of such a risk that a large number of inferior wafers are produced, thereby it is possible to sufficiently restrain the manufacturing cost to a lower value.

It is noted here that although the temperature of the wafer is directly measured in the embodiment shown in FIG. 25, it is not always required to directly measure the temperature. For example, the temperature of the wafer stage 52 may be monitored at a certain position thereon in order to estimate a temperature of a wafer on processing. Further, the temperature of the coolant flowing through the temperature adjusting groove 15 is monitored in order to estimate the temperature of the wafer. In this case that it is sufficient to make the relationship between a monitored temperature and a temperature of a wafer clear beforehand.

Explanation has been made of the embodiments in which the wafer processing apparatus can be commonly used, being mainly concentrated to such a case that the diameters of wafers are different, such as a 8 inch wafer and a 12 inch wafer. The embodiments of the resent invention should not be limited to this case. For the combination of 6 inch wafers and 8 inch wafers can be considered. An embodiment which is commonly used for 6 to 8 inch wafers, and as well 12 inch wafers in all may be considered. Naturally, it goes without saying that the present invention can be applied in such a case that it is commonly used for various combinations including a combination of 12 inch wafers and 14 inch wafers.

Further, the embodiments of the present invention cannot only be applied in the case that the diameters of wafers are different from each other, but also be applied to common use among a plural kinds of wafer stages having different functions, and accordingly, the wafer processing apparatus can be incorporated with an arbitrary function which is different from a function which has been initially incorporated to the wafer processing apparatus, thereby it is also possible to sufficiently lower the costs.

With the wafer processing apparatus and the wafer stage according to the present invention, the positions and the structures of means for securing a wafer stage, component parts which requires alignment between wafer stages, such as an electrical connection mechanism or a wafer transfer mechanism, a cooling structure for a wafer stage, a coolant gas introduction port and monitor probes can be commonly used among a plurality of wafer stages having different functions, thereby it is possible to simply replace a wafer stage with another one at a low cost in order to easily handle them.

Further, with the wafer processing method according to the present invention, the process is at once interrupted when an abnormality is found as to the temperature of the wafer, and the worker can be informed of the abnormality, and accordingly, the number of useless wafers can be restrained to a minimum value, thereby it is possible to sufficiently restrain the manufacturing cost from being increased.

It will be further understood by those skilled in the art that the foregoing description has been made on embodiments of the invention and that various changes and modifications may be made in the invention without departing from the spirit of the invention and scope of the appended claims.

What is claimed is:

1. A wafer processing apparatus comprising a wafer stage on which a semiconductor wafer is mounted so as to be processed, wherein a holding mechanism for the wafer stage is common to a plurality of wafer stages, having different sizes for different wafer sizes so that the wafer processing apparatus has versatility for different wafer stages.

2. A wafer processing apparatus in which a semiconductor wafer is set on a wafer stage so as to be processed, wherein the wafer stage can be separated form a holding part of the wafer processing apparatus, and a mechanism for securing wafer stages having different sizes to the holding part and a mechanism for aligning the wafer stages with the holding part provided so that the wafer processing apparatus has versatility for different wafer stages for different wafer sizes.

3. A wafer processing apparatus as claimed in claim 2, wherein the wafer stage comprises a base and a lower cover, the base is formed in its lower surface with a temperature adjusting groove, and the lower cover is joined to the lower surface of the base.

4. A wafer processing apparatus as claimed in claim 2, wherein the wafer stage is formed of a base formed in its lower surface with a temperature adjusting groove, and the base is jointed at its lower surface to the holding part through the intermediary of an O-ring.

5. A wafer processing apparatus in which a semiconductor-wafer is set on an upper surface of a wafer stage and is then processed, wherein the wafer stage comprises therein a heat insulation part having a thermal conductivity which is smaller than that of a material of the wafer stage, and a temperature adjusting groove for circulating a temperature adjusting medium therethrough in order to cool or heat the wafer stage.

6. A wafer processing apparatus as claimed in claim 5, wherein the temperature adjusting groove is provided only on either one of the inside and the outside of the heat insulation part.

7. A wafer processing apparatus as claimed in claim 5, wherein the temperature adjusting groove is formed on each of the inside and the outside of the heat insulation part.

8. A wafer processing apparatus as claimed in any one of claims 1 and 5, wherein the wafer stage is formed on its outer surface with a dielectric film, and by effecting a potential difference between the dielectric film and the semiconductor wafer so that the semiconductor wafer is secured to the wafer stage by an electrostatic force.

9. A wafer processing apparatus as claimed in claim 8, wherein the dielectric film is formed of a sintered material composed of ceramic as a main component.

10. A wafer processing apparatus as claimed in claim 9, wherein the dielectric film is secured to the wafer stage through either a joint by an electrically conductive brazing material or a joint by an adhesive.

11. A wafer processing apparatus as claimed in claim 8, wherein the dielectric film is a film formed by a chemical vapor phase growth process and made of ceramic as a main component.

12. A wafer processing apparatus as claimed in claim 8, wherein the dielectric film is a film formed by spray coating and made of ceramic as a main component.

13. A wafer stage mounted in a wafer processing apparatus, and for carrying thereon a semiconductor wafer so as to process the semiconductor wafer, wherein the wafer stage has an attaching part for the attachment to the wafer processing apparatus, said attaching part being common to a plurality of wafer stages having different sizes for different wafer sizes, so that the wafer processing apparatus has versatility for different wafer stages.

14. A wafer stage as claimed in claim 13, wherein the wafer stage is configured to enable the wafer stage to be separated from a structure to which the wafer stage is secured, in order to mount any of a plurality of wafer stages having different functions on the structure, a means for securing the wafer stage to the structure, a component part which requires alignment between the structure and the wafer stage, or a structure part is commonly used among a plurality of wafer stages.

15. A wafer stage as claimed in claim 14, wherein the component part or the structure part are an electrical connection structure, a semiconductor wafer transfer mechanism, and a cooling structure for the wafer stage, a through hole for introducing cooling gas between the semiconductor wafer and the wafer stage, or a semiconductor wafer monitor mechanism.

16. A wafer stage as set forth in claim 14, wherein the wafer stage is composed of a base formed therein with a temperature adjusting groove for circulating temperature adjusting medium therethrough in order to cool or heat the wafer stage; and a lower cover joined to she base on the temperature adjusting groove side.

17. A wafer stage for processing a semiconductor wafer, wherein the wafer stage comprises a heat insulation layer and a temperature adjusting groove, the heat insulation layer is made of a material having a thermal conductivity which is smaller than that of a material of the wafer stage; the temperature adjusting groove is adapted to circulate temperature adjusting medium therethrough so as to cool or heat the wafer stage.

18. A wafer stage as claimed in claim 17, wherein the temperature adjusting groove is formed only on either the inside or the outside of the heat insulating layer.

19. A wafer stage as claimed in claim 17, wherein the temperature adjusting groove is provided in each of the inside and the outside of the heat insulation layer.

20. A wafer stage as claimed in claim 17, wherein a dielectric film is formed on the outer surface of the wafer stage, and an electrical potential difference is provided between the dielectric film and the semiconductor wafer so as to produce an electrostatic chuck function for fixing the semiconductor wafer with a static electric force.

21. A wafer stage as claimed in claim 20, wherein the dielectric film is formed of a sintered material comprising a ceramic as a main component.

22. A wafer stage as claimed in claim 20, wherein the dielectric film is secured through either a joint by an electrically conductive brazing material or a joint by an adhesive.

23. A wafer stage as claimed in claim 20, wherein said dielectric film is a film formed by a chemical vapor phase growth process and made of ceramic as a main component.

24. A wafer stage as claimed in claim 20, wherein the dielectric film is a film formed by spray coating, and made of ceramic as a main component.

* * * * *